US012627546B2

(12) United States Patent
Gao et al.

(10) Patent No.: US 12,627,546 B2
(45) Date of Patent: May 12, 2026

(54) SIGNAL TRANSMISSION METHOD AND APPARATUS

(71) Applicant: HUAWEI TECHNOLOGIES CO., LTD., Guangdong (CN)

(72) Inventors: Lei Gao, Beijing (CN); Xingqing Cheng, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 49 days.

(21) Appl. No.: 18/540,566

(22) Filed: Dec. 14, 2023

(65) Prior Publication Data

US 2024/0113926 A1 Apr. 4, 2024

Related U.S. Application Data

(63) Continuation of application No. PCT/CN2021/100626, filed on Jun. 17, 2021.

(51) Int. Cl.
*H04L 27/18* (2006.01)
*H03M 13/13* (2006.01)

(52) U.S. Cl.
CPC ............ *H04L 27/18* (2013.01); *H03M 13/13* (2013.01)

(58) Field of Classification Search
CPC ... H04L 25/0242; H04L 27/34; H04L 5/0048; H04L 25/03343; H04L 25/0226
See application file for complete search history.

(56) References Cited

U.S. PATENT DOCUMENTS 6,456,627 B1 * 9/2002 Frodigh ............... H04B 7/2628
370/465
9,461,699 B2 * 10/2016 Willenegger .......... H04B 1/707
11,616,598 B2 * 3/2023 Xu .......................... H04L 1/203
370/310

(Continued)

FOREIGN PATENT DOCUMENTS

EP 3726771 A1 10/2020
WO 2020167077 A1 8/2020

OTHER PUBLICATIONS

Machine translation of CN 108235444 B (Year: 2021).*
Machine translation of CN 114125725A (Year: 2022).*

*Primary Examiner* — Jean B Corrielus
(74) *Attorney, Agent, or Firm* — WOMBLE BOND DICKINSON (US) LLP

(57) ABSTRACT
This application provides a signal transmission method and apparatus, applied to automatic driving, assisted driving, and the like. The method includes: A first device generates a first signal, where the first signal includes a first part and a second part, the second part is modulated in a phase shift keying PSK modulation scheme, the second part is encoded by using polar code, the first part is used to transmit a preconfigured sequence, a predefined sequence, or a sequence generated according to a predefined rule, and the second part is used to transmit control information. The first device sends the first signal to a second device. The second device obtains the control information. The PSK modulation scheme can improve sensitivity of a signal receive end, and improve anti-noise and anti-interference capabilities. In addition, the second part is encoded by using the polar code, which can improve anti-noise and anti-interference performance.

17 Claims, 6 Drawing Sheets

(56) References Cited

U.S. PATENT DOCUMENTS

| | | | | |
|---|---|---|---|---|
| 2004/0214602 A1* | 10/2004 | Aoyama | ............. | H04W 72/542 |
| | | | | 455/67.13 |
| 2005/0220218 A1* | 10/2005 | Jensen | ................ | H04L 27/0008 |
| | | | | 375/302 |
| 2008/0284536 A1* | 11/2008 | Lee | ......................... | H03F 3/217 |
| | | | | 332/119 |
| 2020/0213978 A1* | 7/2020 | Iyer | ....................... | H04L 1/1812 |
| 2021/0051510 A1 | 2/2021 | Chae et al. | | |
| 2021/0266100 A1* | 8/2021 | Sankar | .................. | H04L 1/0068 |

* cited by examiner

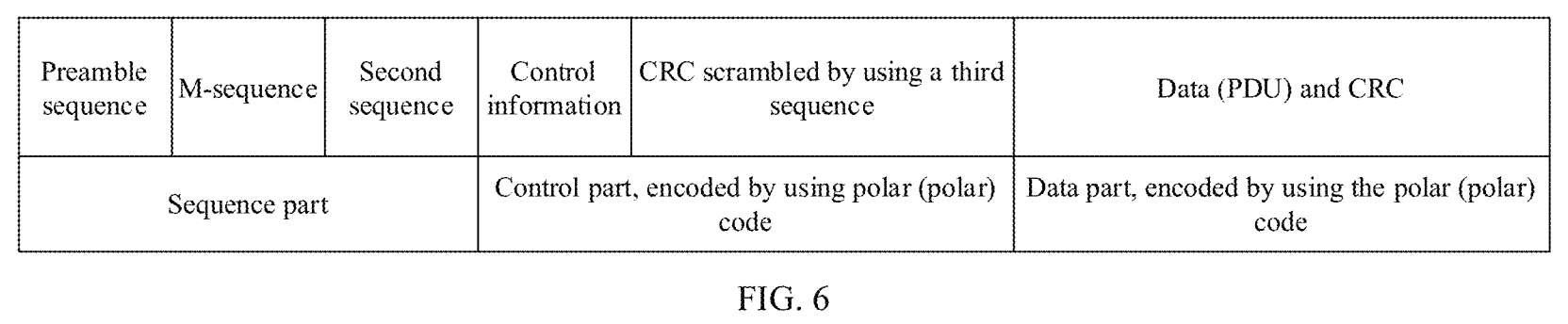

| Preamble sequence | | Control information | Data (PDU) and CRC |
|---|---|---|---|
| M-sequence | Second sequence | CRC scrambled by using a third sequence | |
| Sequence part | | Control part, encoded by using polar (polar) code | Data part, encoded by using the polar (polar) code |

FIG. 6

SIGNAL TRANSMISSION METHOD AND APPARATUS

CROSS-REFERENCE TO RELATED APPLICATIONS

This application is a continuation of International Application No. PCT/CN2021/100626, filed on Jun. 17, 2021, the disclosure of which is hereby incorporated by reference in its entirety.

TECHNICAL FIELD

This application relates to the field of communication technologies, and in particular, to a signal transmission method and apparatus.

BACKGROUND

In a wireless communication scenario, there may be a plurality of communication domains in a communication area or range. One communication domain is a system including: a group of communication nodes that have a communication relationship, and a communication connection relationship (namely, a communication link) between the communication nodes. One communication domain includes one primary communication node (which may be referred to as a primary node for short) and at least one secondary communication node (which may be referred to as a secondary node for short). The primary node manages a time-frequency resource of the communication domain, and has a function of scheduling a resource for the communication link between the communication nodes in the communication domain. Generally, a plurality of communication domains exist densely. Because the communication domains work independently, there may be mutual interference between the communication domains. However, currently, anti-interference performance is poor during signal transmission between communication nodes. As a result, the signal transmission may fail.

SUMMARY

This application provides a signal transmission method and apparatus, to improve anti-interference performance during signal transmission between communication nodes.

According to a first embodiment, this application provides a signal transmission method. The method may be applied to a first device, and a processor, a chip, a chip system, a function module, or the like of the first device. The method may include: generating a first signal, where the first signal includes a first part and a second part, the second part may be modulated in a phase shift keying (PSK) modulation scheme, the second part may be encoded by using polar code, the first part may be used to transmit a preconfigured sequence, a predefined sequence, or a sequence generated according to a predefined rule, and the second part may be used to transmit control information; and sending the first signal.

According to the method, the control information in the first signal is modulated in the PSK modulation scheme. Compared with a frequency modulation-type modulation scheme and an amplitude modulation-type modulation scheme, in the PSK modulation scheme, receiving sensitivity of a signal receive end to the control information can be improved, and anti-noise and anti-interference performance can be improved. The control information is encoded by using the polar code. This can also improve receiving sensitivity of the signal receive end to the control information, and can improve anti-noise and anti-interference performance. The control information is modulated in the PSK modulation scheme and encoded by using the polar code. This can improve accuracy of receiving the control information by the signal receive end, thereby improving reliability of content indicated by the control information, and ensuring reliability of data transmission.

In an embodiment, the first part may be modulated in the PSK modulation scheme. The first part and the second part have a same modulation scheme or a same type of a modulation scheme, and results of synchronization and channel estimation at the signal receive end can better adapt to a demodulation requirement of the second part, so that anti-noise and anti-interference performance of signal transmission can be improved. In addition, the first part and the second part use a same modulation scheme or a same type of modulation scheme, so that implementation complexity of a signal transmit end and the signal receive end can be reduced.

In an embodiment, the first part may successively include a preamble sequence and at least one first sequence, the first sequence may include an M-sequence and/or a second sequence, and the second sequence may be a sequence generated based on an identifier of a first device and/or a sequence generated based on an identifier of a link of the first device. In this way, synchronization and channel estimation performance at the signal receive end can be improved. A side lobe of an autocorrelation function of the M-sequence is small, and a probability of errors occurring in synchronization and channel estimation is low. Therefore, the M-sequence has excellent synchronization and channel estimation performance at a low signal to interference plus noise ratio. Because identifiers of different devices and/or identifiers of different links are usually different, sequences generated based on the identifiers of the different devices and/or the identifiers of the different links are usually different, that is, the second sequence in an effective signal is different from the second sequence in the interference channel. Therefore, the second sequence may have an additional effect of filtering interference.

In an embodiment, the sending the first signal may be: sending the first part; and sending the second part after sending the first part. In this way, when receiving the first signal, the signal receive end may first receive the first part, and then receive the second part. Therefore, after receiving the second part, the signal receive end may demodulate the second part by using results of automatic gain control (AGC), synchronization, and channel estimation of the first part. If the first part and the second part are sent in an inverted order when the first signal is sent, after receiving the second part, the signal receive end cannot demodulate the second part because there is no result of synchronization and channel estimation, and needs to buffer and wait to receive the first part, and obtain the results of synchronization and channel estimation based on the first part before demodulating the second part. As a result, a delay is increased, storage space and storage energy consumption are wasted, and some data starting with the second part may be unavailable due to AGC.

In an embodiment, the first signal may further include a data part, and the data part may be modulated in the PSK modulation scheme. In this way, data can be transmitted. In addition, the data is modulated in the PSK modulation scheme, so that anti-noise and anti-interference performance can be improved.

In an embodiment, symbol rates of at least two of the first part, the second part, and the data part may be the same. This can reduce overheads of a switching interval. In addition, this is easy to implement.

In an embodiment, a symbol rate of the data part may be 1 megahertz, 2 megahertz, or 4 megahertz. A higher symbol rate may bring a higher peak rate.

In an embodiment, the first part may include two same sequences. This improves frequency synchronization precision and reduces complexity of a frequency synchronization algorithm.

In an embodiment, the second part may be encoded by using a first modulation scheme and a first code rate, where the first modulation scheme may be one of the PSK modulation schemes, the first modulation scheme may be precon-figured or predefined, and the first code rate may be pre-configured, predefined, or determined according to a predefined rule; the first modulation scheme may be selected based on a first set, the first code rate may be selected based on the first set, and the first set may indicate at least one combination of a modulation scheme and a code rate; or the first modulation scheme may be selected based on a second set, the second set may indicate at least one modulation scheme, the first code rate may be selected based on a third set, and the third set may indicate at least one code rate. In this way, implementation complexity of decoding the second part can be reduced, redundancy is added at a low signal-to-noise ratio to implement better anti-noise and anti-inter-ference performance, and redundancy is reduced at a high signal to interference plus noise ratio to reduce overheads.

In an embodiment, the first part may indicate the first modulation scheme and/or the first code rate. In this way, blind decoding of the second part by the signal receive end can be avoided.

In an embodiment, the second part may include a cyclic redundancy check bit, so that reliability of the control information of the second part can be improved.

In an embodiment, the second part may be scrambled by using a third sequence, or the cyclic redundancy check bit included in the second part may be scrambled by using the third sequence, and the third sequence may be a sequence generated based on the identifier of the first device and/or a sequence generated based on the identifier of the link of the first device. In this way, interference data can be filtered out without increasing resource overheads.

In an embodiment, the data part may be encoded by using the polar code, so that anti-interference performance of the data part can be improved.

In an embodiment, the second part may indicate a code rate for polar code encoding or whether the data part is encoded by using the polar code. In this way, blind detection on the data part can be avoided, and a plurality of code rates can be flexibly implemented for the data part, to flexibly adapt to different transmission requirements and channel conditions.

In an embodiment, the second part may indicate a modu-lation scheme of the data part. In this way, blind detection on the data part can be avoided, and the data part can be flexibly selected in more modulation schemes, to flexibly adapt to different transmission requirements and channel conditions.

In an embodiment, the second part may indicate length information of the data part. In this way, blind detection on the data part can be avoided, and a length of the data part can be flexible and variable, to flexibly adapt to different trans-mission requirements and channel conditions.

In an embodiment, the second part may indicate at least one of the following: a number of transmission data of the data part, a number of a protocol data unit (PDU) of the data part, a number of a payload in the PDU, whether the transmission data is retransmitted, whether the PDU is retransmitted, or whether the payload in the PDU is retrans-mitted. In this way, the signal receive end can implement retransmission combination accordingly, and can filter out data that has been correctly received or does not need to be received.

In an embodiment, the second part may indicate at least one of the following: feedback information of transmission data of a second device, feedback information of a PDU of the second device, feedback information of a payload in the PDU of the second device, a number of data expected to be transmitted by the second device next time, a number of a PDU expected to be transmitted by the second device next time, a number of a payload in the PDU expected to be transmitted by the second device next time, whether the data expected to be transmitted by the second device next time is retransmitted, whether the PDU expected to be transmitted by the second device next time is retransmitted, or whether the payload in the PDU expected to be transmitted by the second device next time is retransmitted. In this way, the signal receive end can determine whether new data or old data should be transmitted next time, or determine whether data transmitted last time has been correctly received.

In an embodiment, the second part may indicate whether the data part exists, indicate whether the data part includes the PDU, or indicate whether the payload in the PDU of the data part is null. In this way, the signal receive end can be prevented from performing unnecessary decoding on a null packet, so as to reduce receiving power consumption.

In an embodiment, the second part may indicate at least one of the following: a type of data in the data part, a type of the PDU in the data part, a type of the payload of the PDU in the data part, grouping information of data in the data part, grouping information of the PDU in the data part, or grouping information of the payload of the PDU in the data part. In this way, the signal receive end can receive and respond to only data related to the signal receive end, so as to reduce receiving power consumption.

In an embodiment, the first signal is used for broadcast, the second part may include type information of the broad-cast, and the type information of the broadcast may include at least one of the following: whether the broadcast can be scanned, whether the broadcast can be connected, whether the broadcast can be used for directional transmission, or whether the broadcast can be used for non-directional trans-mission. In this way, the signal receive end can receive and respond to only data related to the signal receive end, so as to reduce receiving power consumption.

In an embodiment, the second part may indicate whether to continue to send data by using a currently allocated or currently used resource or resource unit, and/or indicate whether to continue to receive data by using the currently allocated or currently used resource or resource unit. In this way, a resource control information can be transmitted by using a most reliable resource, so that a consensus can be quickly reached on avoiding unnecessary transmission as much as possible, so as to save resources and reduce power consumption.

In an embodiment, the second part may indicate whether there is data to be sent. In this way, the signal transmit end (namely, the first device) can negotiate a subsequent trans-mission policy with the signal receive end (namely, the second device), to quickly reach a consensus on avoiding unnecessary transmission as much as possible, so as to save resources and reduce power consumption.

In an embodiment, the second part may indicate whether data can continue to be received. In this way, the signal receive end (namely, the second device) can stop sending subsequent data in time, to save resources and reduce power consumption.

In an embodiment, the second part may include a reference signal distributed in time domain. In this way, channel estimation and synchronization (channel phase tracking) performance can be improved, thereby improving anti-noise and anti-interference capabilities.

In an embodiment, that the second part includes a reference signal distributed in time domain may be: The second part may include reference signals distributed at equal intervals in time domain.

In an embodiment, the data part may include a reference signal distributed in time domain. In this way, channel estimation and synchronization performance can be improved, thereby improving anti-noise and anti-interference capabilities.

In an embodiment, that the data part includes a reference signal distributed in time domain may be: The data part may include reference signals distributed at equal intervals in time domain.

In an embodiment, the second part may indicate a distribution pattern of the reference signal of the data part. In this way, blind detection at the signal receive end (namely, the second device) can be avoided.

In an embodiment, the second part and the data part may include a reference signal distributed in time domain. In this way, channel estimation and synchronization performance can be improved, thereby improving anti-noise and anti-interference capabilities. In one embodiment, the second part may indicate the distribution pattern of the reference signal of the data part.

In an embodiment, that the second part and the data part include a reference signal distributed in time domain may be: The second part includes reference signals distributed at equal intervals in time domain based on a first pattern, and the data part includes reference signals distributed at equal intervals in time domain based on a second pattern, where the first pattern and the second pattern may be the same or different; or a part including the second part and the data part includes reference signals distributed at equal intervals in time domain based on a third pattern.

In an embodiment, the method further includes: sending a second signal, where the second signal may be modulated in a Gaussian frequency-shift keying GFSK modulation scheme. In this way, the first device and the second device may further support a frame structure of GFSK modulation, so that support for a low-cost and low-power-consumption device can be reserved.

In an embodiment, any part of the second signal is not encoded. In this way, a design can be simplified, and the low-cost and low-power-consumption device supports only a basic capability, thereby avoiding an increase in costs and power consumption caused by encoding and decoding additionally supported by this type of device.

According to a second embodiment, this application provides a signal transmission method. The method may be applied to a second device, and a processor, a chip, a chip system, a function module, or the like of the second device. The method may include: receiving a first signal, where the first signal includes a first part and a second part, the second part may be modulated in a PSK modulation scheme, the second part may be encoded by using polar code, the first part may be used to transmit a preconfigured sequence, a predefined sequence, or a sequence generated according to a predefined rule, and the second part may be used to transmit control information; and obtaining the control information.

According to the method, the control information in the first signal is modulated in the PSK modulation scheme. Compared with a frequency modulation-type modulation scheme and an amplitude modulation-type modulation scheme, in the PSK modulation scheme, receiving sensitivity of a signal receive end to the control information can be improved, and anti-noise and anti-interference performance can be improved. The control information is encoded by using the polar code. This can also improve receiving sensitivity of the signal receive end to the control information, and can improve anti-noise and anti-interference performance. The control information is modulated in the PSK modulation scheme and encoded by using the polar code, so that accuracy of receiving the control information by a signal receive end can be improved, thereby improving reliability of content indicated by the control information, and ensuring reliability of data transmission.

In an embodiment, the first part may be modulated in the PSK modulation scheme. The first part and the second part have a same modulation scheme or a same type of a modulation scheme, and results of synchronization and channel estimation at the signal receive end can better adapt to a demodulation requirement of the second part, so that anti-noise and anti-interference performance of signal transmission can be improved. In addition, the first part and the second part use a same modulation scheme or a same type of modulation scheme, so that implementation complexity of a signal transmit end and the signal receive end can be reduced.

In an embodiment, the first part may successively include a preamble sequence and at least one first sequence, the first sequence may include an M-sequence and/or a second sequence, and the second sequence may be a sequence generated based on an identifier of a first device and/or a sequence generated based on an identifier of a link of the first device. In this way, synchronization and channel estimation performance at the signal receive end can be improved. A side lobe of an autocorrelation function of the M-sequence is small, and a probability of errors occurring in synchronization and channel estimation is low. Therefore, the M-sequence has excellent synchronization and channel estimation performance at a low signal to interference plus noise ratio. Because identifiers of different devices and/or identifiers of different links are usually different, sequences generated based on the identifiers of the different devices and/or the identifiers of the different links are usually different, that is, the second sequence in an effective signal is different from the second sequence in the interference channel. Therefore, the second sequence has an additional effect of filtering interference.

In an embodiment, the receiving a first signal may be: receiving the first part; and receiving the second part after receiving the first part. In this way, after receiving the second part, the signal receive end can demodulate the second part by using results of AGC, synchronization, and channel estimation of the first part. If the first part and the second part are received in an inverted order when the first signal is received, after receiving the second part, the signal receive end cannot demodulate the second part because there is no result of synchronization and channel estimation, and needs to buffer and wait to receive the first part, and obtain the results of synchronization and channel estimation based on the first part before demodulating the second part. As a result, a delay is increased, storage space and storage energy consumption are wasted, and some data starting with the second part may be unavailable due to AGC.

In an embodiment, the first signal may further include a data part, and the data part may be modulated in the PSK modulation scheme. In this way, data can be transmitted. In addition, the data is modulated in the PSK modulation scheme, so that anti-noise and anti-interference performance can be improved.

In an embodiment, symbol rates of at least two of the first part, the second part, and the data part may be the same. This can reduce overheads of a switching interval. In addition, this is easy to implement.

In an embodiment, a symbol rate of the data part may be 1 megahertz, 2 megahertz, or 4 megahertz. A higher symbol rate may bring a higher peak rate.

In an embodiment, the first part may include two same sequences. This improves frequency synchronization precision and reduces complexity of a frequency synchronization algorithm.

In an embodiment, the second part may be encoded by using a first modulation scheme and a first code rate, where the first modulation scheme may be one of the PSK modulation schemes, the first modulation scheme may be preconfigured or predefined, and the first code rate may be preconfigured, predefined, or determined according to a predefined rule; the first modulation scheme may be selected based on a first set, the first code rate may be selected based on the first set, and the first set may indicate at least one combination of a modulation scheme and a code rate; or the first modulation scheme may be selected based on a second set, the second set may indicate at least one modulation scheme, the first code rate may be selected based on a third set, and the third set may indicate at least one code rate. In this way, implementation complexity of decoding the second part can be reduced, redundancy is added at a low signal-to-noise ratio to implement better anti-noise and anti-interference performance, and redundancy is reduced at a high signal to interference plus noise ratio to reduce overheads.

In an embodiment, the first part may indicate the first modulation scheme and/or the first code rate. In this way, blind decoding of the second part by the signal receive end can be avoided.

In an embodiment, the second part may include a cyclic redundancy check bit, so that reliability of the control information included in the second part can be improved.

In an embodiment, the second part may be scrambled by using a third sequence, or the cyclic redundancy check bit included in the second part may be scrambled by using the third sequence, and the third sequence may be a sequence generated based on the identifier of the first device and/or a sequence generated based on the identifier of the link of the first device. In this way, interference data can be filtered out without increasing resource overheads.

In an embodiment, the data part may be encoded by using the polar code, so that anti-interference performance of the data part can be improved.

In an embodiment, the second part may indicate a code rate for polar code encoding or whether the data part is encoded by using the polar code. In this way, blind detection on the data part can be avoided, and a plurality of code rates can be flexibly implemented for the data part, to flexibly adapt to different transmission requirements and channel conditions.

In an embodiment, the second part may indicate a modulation scheme of the data part. In this way, blind detection on the data part can be avoided, and the data part can be flexibly selected in more modulation schemes, to flexibly adapt to different transmission requirements and channel conditions.

In an embodiment, the second part may indicate length information of the data part. In this way, blind detection on the data part can be avoided, and a length of the data part can be flexible and variable, to flexibly adapt to different transmission requirements and channel conditions.

In an embodiment, the second part may indicate at least one of the following: a number of transmission data of the data part, a number of a PDU of the data part, a number of a payload in the PDU, whether the transmission data is retransmitted, whether the PDU is retransmitted, or whether the payload in the PDU is retransmitted. In this way, the signal receive end can implement retransmission combination accordingly, and can filter out data that has been correctly received or does not need to be received.

In an embodiment, the second part may indicate at least one of the following: feedback information of transmission data of a second device, feedback information of a PDU of the second device, feedback information of a payload in the PDU of the second device, a number of data expected to be transmitted by the second device next time, a number of a PDU expected to be transmitted by the second device next time, a number of a payload in the PDU expected to be transmitted by the second device next time, whether the data expected to be transmitted by the second device next time is retransmitted, whether the PDU expected to be transmitted by the second device next time is retransmitted, or whether the payload in the PDU expected to be transmitted by the second device next time is retransmitted. In this way, the signal receive end can determine whether new data or old data should be transmitted next time, or determine whether data transmitted last time has been correctly received.

In an embodiment, the second part may indicate whether the data part exists, indicate whether the data part includes the PDU, or indicate whether the payload in the PDU of the data part is null. In this way, the signal receive end can be prevented from performing unnecessary decoding on a null packet, so as to reduce receiving power consumption.

In an embodiment, the second part may indicate at least one of the following: a type of data in the data part, a type of the PDU in the data part, a type of the payload of the PDU in the data part, grouping information of data in the data part, grouping information of the PDU in the data part, or grouping information of the payload of the PDU in the data part. In this way, the signal receive end can receive and respond to only data related to the signal receive end, so as to reduce receiving power consumption.

In an embodiment, the first signal is used for broadcast, the second part may include type information of the broadcast, and the type information of the broadcast may include at least one of the following: whether the broadcast can be scanned, whether the broadcast can be connected, whether the broadcast can be used for directional transmission, or whether the broadcast can be used for non-directional transmission. In this way, the signal receive end can receive and respond to only data related to the signal receive end, so as to reduce receiving power consumption.

In an embodiment, the second part may indicate whether to continue to send data by using a currently allocated or currently used resource or resource unit, and/or indicate whether to continue to receive data by using the currently allocated or currently used resource or resource unit. In this way, a resource control information can be transmitted by using a most reliable resource, so that a consensus can be quickly reached on avoiding unnecessary transmission as much as possible, so as to save resources and reduce power consumption.

In an embodiment, the second part may indicate whether there is data to be sent. In this way, the signal transmit end (namely, the first device) can negotiate a subsequent transmission policy with the signal receive end (namely, the second device), to quickly reach a consensus on avoiding unnecessary transmission as much as possible, so as to save resources and reduce power consumption.

In an embodiment, the second part may indicate whether data can continue to be received. In this way, the signal receive end (namely, the second device) can stop sending subsequent data in time, to save resources and reduce power consumption.

In an embodiment, the second part may include a reference signal distributed in time domain. In this way, channel estimation and synchronization performance can be improved, thereby improving anti-noise and anti-interference capabilities.

In an embodiment, that the second part includes a reference signal distributed in time domain may be: The second part may include reference signals distributed at equal intervals in time domain.

In an embodiment, the data part may include a reference signal distributed in time domain. In this way, channel estimation and synchronization performance can be improved, thereby improving anti-noise and anti-interference capabilities.

In an embodiment, that the data part includes a reference signal distributed in time domain may be: The data part may include reference signals distributed at equal intervals in time domain.

In an embodiment, the second part may indicate a distribution pattern of the reference signal of the data part. In this way, blind detection at the signal receive end (namely, the second device) can be avoided.

In an embodiment, the second part and the data part may include a reference signal distributed in time domain. In this way, channel estimation and synchronization performance can be improved, thereby improving anti-noise and anti-interference capabilities. In one embodiment, the second part may indicate the distribution pattern of the reference signal of the data part.

In an embodiment, that the second part and the data part include a reference signal distributed in time domain may be: The second part includes reference signals distributed at equal intervals in time domain based on a first pattern, and the data part includes reference signals distributed at equal intervals in time domain based on a second pattern, where the first pattern and the second pattern may be the same or different; or a part including the second part and the data part includes reference signals distributed at equal intervals in time domain based on a third pattern.

In an embodiment, the method further includes: receiving a second signal, where the second signal may be modulated in a GFSK modulation scheme. In this way, the first device and the second device may further support a frame structure of GFSK modulation, so that support for a low-cost and low-power-consumption device can be reserved.

In an embodiment, any part of the second signal is not encoded. In this way, a design can be simplified, and the low-cost and low-power-consumption device supports only a basic capability, thereby avoiding an increase in costs and power consumption caused by encoding and decoding additionally supported by this type of device.

According to a third embodiment, this application further provides a signal transmission apparatus. The signal transmission apparatus has a function of implementing the first device in the first embodiment or other examples of the first embodiment. The function may be implemented by hardware, or may be implemented by hardware executing corresponding software. The hardware or the software includes one or more modules corresponding to the foregoing function.

In an embodiment, a structure of the signal transmission apparatus includes a transceiver unit and a processing unit. These units may perform corresponding functions of the first device in the first embodiment or other examples of the first embodiment. For details, refer to the detailed descriptions in the method examples. Details are not described herein again.

In an embodiment, a structure of the signal transmission apparatus includes a transceiver and a processor, and further includes a memory. The transceiver is configured to receive and send a signal and data, and is configured to communicate and interact with another device in a communication system. The processor is configured to support the signal transmission apparatus in performing corresponding functions of the first device in the first embodiment or other examples of the first embodiment. The memory is coupled to the processor and stores program instructions and data for the signal transmission apparatus.

According to a fourth embodiment, this application further provides a signal transmission apparatus. The signal transmission apparatus has a function of implementing the second device in the second embodiment or other examples of the second embodiment. The function may be implemented by hardware, or may be implemented by hardware executing corresponding software. The hardware or the software includes one or more modules corresponding to the foregoing function.

In an embodiment, a structure of the signal transmission apparatus includes a transceiver unit and a processing unit. These units may perform corresponding functions of the second device in the second embodiment or other examples of the second embodiment. For details, refer to the detailed descriptions in the method examples. Details are not described herein again.

In an embodiment, a structure of the signal transmission apparatus includes a transceiver and a processor, and further includes a memory. The transceiver is configured to receive and send a signal and data, and is configured to communicate and interact with another device in a communication system. The processor is configured to support the signal transmission apparatus in performing corresponding functions of the second device in the second embodiment or other examples of the second embodiment. The memory is coupled to the processor and stores program instructions and data for the signal transmission apparatus.

According to a fifth embodiment, an embodiment of this application provides a communication system, where the communication system may include the first device and the second device mentioned above.

According to a sixth embodiment, an embodiment of this application provides a computer-readable storage medium. The computer-readable storage medium stores program instructions. When the program instructions are run on a computer, the computer is enabled to perform the method according to any one of the first embodiment and other of the first embodiment, or any one of the second embodiment and other of the second embodiment of embodiments of this application. For example, the computer-readable storage medium may be any usable medium accessible to the computer. By way of example and not limitation, the computer-readable medium may include a non-transient computer-readable medium, a random access memory (RAM), a read-only memory (ROM), an electrically erasable programmable read-only memory (electrically EPROM, EEPROM), a CD-ROM or another optical disc storage, a magnetic disk storage medium or another magnetic storage device, or any other medium that can be used to carry or store expected program code in a form of an instruction or a data structure and can be accessed by the computer.

According to a seventh embodiment, an embodiment of this application provides a computer program product including computer program code or instructions. When the computer program product runs on a computer, the computer is enabled to implement the method according to any one of the first embodiment or the second embodiment.

According to an eighth embodiment, this application further provides a chip system, including at least one processor and a communication interface. The communication interface is configured to send and/or receive a signal, and the at least one processor is configured to invoke a computer program stored in at least one memory, so that the chip system implements the method according to any one of the first embodiment or the second embodiment.

For the third embodiment to the eighth embodiment and technical effects that can be achieved in the third embodiment to the eighth embodiment, refer to the descriptions of technical effects that can be achieved in the first embodiment or the possible solutions in the first embodiment. Details are not described herein again.

BRIEF DESCRIPTION OF DRAWINGS

FIG. 6 is a schematic diagram of a frame structure of a first signal according to this application;

DESCRIPTION OF EMBODIMENTS

The following describes in detail embodiments of this application with reference to accompanying drawings.

Embodiments of this application provide a signal transmission method and apparatus, to improve anti-interference performance during signal transmission between communication nodes. The method and the apparatus in this application are based on a same technical concept. Because problem-resolving principles of the method and the apparatus are similar, mutual reference may be made to implementations of the apparatus and the method, and repeated parts are not described again.

In this application, "At least one item (piece or type)" means one item (piece or type) or more items (pieces or types), and "a plurality of items (pieces or types)" means two items (pieces or types) or more items (pieces or types). "At least one of the following" or a similar expression thereof means any combination of these items, including any combination of a single item or a plurality of items. For example, at least one of a, b, or c may represent: a, b, c, a and b, a and c, b and c, or a, b, and c, where a, b, and c may be singular or plural.

In this application, "and/or" describes an association relationship between associated objects, and indicates that three relationships may exist. For example, A and/or B may indicate the following three cases: A exists alone, both A and B exist, and B exists alone, where A and B may be singular or plural. The character "/" generally indicates an "or" relationship between the associated objects.

In the descriptions of this application, terms such as "first" and "second" are only for distinction and description, but cannot be understood as indicating or implying relative importance, or as indicating or implying an order.

The signal transmission method provided in embodiments of this application may be applied to a scenario in which signal transmission exists. In this scenario, a signal is sent by a signal transmit end, and a signal is received by a signal receive end.

Figure 1:
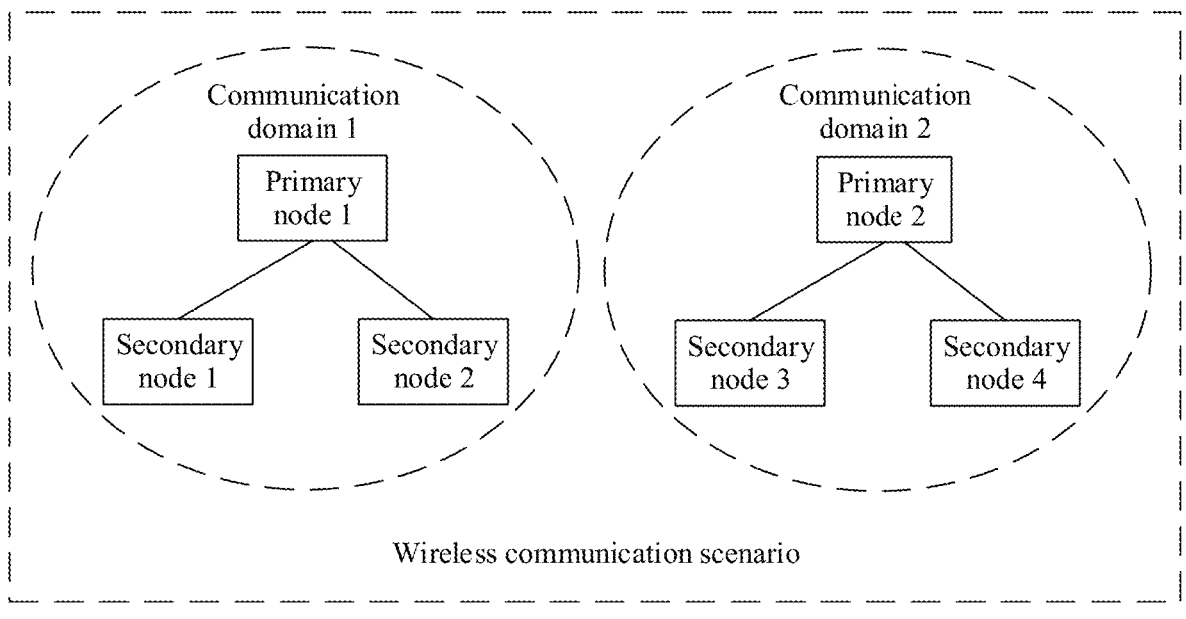
FIG. 1 is a schematic diagram of a wireless communication scenario according to this application.

For example, the signal transmission method provided in embodiments of this application may be applied to a wireless communication scenario, for example, a short-distance wireless communication scenario, a wireless wide area communication scenario, or a wireless local area communication scenario. In a wireless communication scenario, a plurality of communication domains may be included in a communication area or range. The communication domain may be a system including: a group of communication nodes that have a communication relationship, and a communication connection relationship (namely, a communication link) between the communication nodes. One communication domain may include one primary communication node (which may be referred to as a primary node for short) and at least one secondary communication node (which may be referred to as a secondary node for short). The primary node manages a time-frequency resource of the communication domain, and has a function of scheduling a resource for the communication link between the communication nodes in the communication domain. For example, FIG. 1 is a schematic diagram of a possible wireless communication scenario to which a signal transmission method is applicable according to this application. In the wireless communication scenario, at least one primary node and at least one secondary node corresponding to each primary node may be included. For example, as shown in FIG. 1, the wireless communication scenario includes a primary node 1 and a primary node 2. The primary node 1, a secondary node 1, and a secondary node 2 form a communication domain 1, and the primary node 1 communicates with the secondary node 1 and the secondary node 2. The primary node 2, a secondary node 3, and a secondary node 4 form a communication domain 2, and the primary node 2 communicates with the secondary node 3 and the secondary node 4.

In an example, when the wireless communication scenario shown in FIG. 1 is a wireless wide area communication scenario, the primary node 1 and the primary node 2 may be network devices, and the secondary node 1 to the secondary node 4 may be terminal devices. The network device may be a device that has a wireless transceiver function or a chip that can be disposed in the network device.

The network device includes but is not limited to a generation NodeB (gNB), a radio network controller (RNC), a NodeB (NB), a base station controller (BSC), a base transceiver station (BTS), a home evolved NodeB (for example, a home evolved NodeB, or a home NodeB, HNB), a baseband unit (BBU), an access point (AP) in a wireless fidelity (Wi-Fi) system, a wireless relay node, a wireless backhaul node, a transmission and reception point (TRP, or transmission point, TP). The network device may alternatively be a network node, for example, a baseband unit (BBU) or a distributed unit (DU), that constitutes a gNB or a transmission point.

In some deployments, a gNB may include a central unit (CU) and a DU. The gNB may further include a radio frequency unit (radio unit, RU). The CU implements a part of functions of the gNB, and the DU implements a part of the functions of the gNB. For example, the CU implements functions of a radio resource control (RRC) layer and a packet data convergence protocol (PDCP) layer. The DU implements functions of a radio link control (RLC) layer, a media access control (MAC) layer, and a physical layer (PHY). Information at the RRC layer eventually becomes information at the PHY layer, or is converted from the information at the PHY layer. Therefore, in the architecture, higher layer signaling such as RRC layer signaling or PHCP layer signaling may also be considered as being sent by the DU or sent by the DU and the RU. It may be understood that the network device may be a CU node, a DU node, or a device including a CU node and a DU node. In addition, the CU may be classified as a network device in an access network RAN, or the CU may be classified as a network device in a core network CN. This is not limited herein.

The terminal device may also be referred to as user equipment (UE), an access terminal, a subscriber unit, a subscriber station, a mobile station, a remote station, a remote terminal, a mobile device, a user terminal, a terminal, a wireless communication device, a user agent, or a user apparatus. The terminal device in this embodiment of this application may be a mobile phone, a tablet computer (Pad), a computer with a wireless transceiver function, a virtual reality (VR) terminal device, an augmented reality (AR) terminal device, a wireless terminal in industrial control, a wireless terminal in self driving, a wireless terminal in remote medical, a wireless terminal in a smart grid, a wireless terminal in transportation safety, a wireless terminal in a smart city, an intelligent wearable device (smart glasses, a smart watch, a smart headset, or the like), a wireless terminal in a smart home, and the like; or may be a chip, a chip module (or a chip system), or the like that can be disposed in the foregoing device. An application scenario is not limited in embodiments of this application. A terminal device having a wireless transceiver function and a chip that may be disposed in the terminal device are collectively referred to as a terminal device in this application.

In another example, when the wireless communication scenario shown in FIG. 1 is a wireless local area communication scenario, the primary node 1 and the primary node 2 may be access points (APs), and the secondary node 1 to the secondary node 4 may be stations.

In still another example, when the wireless communication scenario shown in FIG. 1 is a short-distance wireless communication scenario, examples of the primary node and the secondary node in different short-distance wireless communication scenarios are different. For example, when the short-distance wireless communication scenario is an in-vehicle wireless communication scenario, the primary node 1 and the primary node 2 may be cockpit domain controllers (CDCs), and the secondary node 1 to the secondary node 4 may be vehicle-mounted music horns and vehicle-mounted atmosphere lights. For another example, when the short-distance wireless communication scenario is an intelligent wearable wireless communication scenario, the primary node 1 and the primary node 2 may be mobile phones, and the secondary node 1 to the secondary node 4 may be headsets. For another example, when the short-distance wireless communication scenario is a home wireless communication scenario, the primary node 1 and the primary node 2 may be home wireless gateways, and the secondary node 1 to the secondary node 4 may be household appliances. For another example, when the short-distance wireless communication scenario is an industrial short-distance wireless communication scenario, the primary node 1 and the primary node 2 may be industrial wireless gateways, and the secondary node 1 to the secondary node 4 may be automated guided vehicles (AGVs), machine tools, or the like.

Certainly, the foregoing examples of the primary node and the secondary node are merely examples. This is not limited in this application. It should be noted that, when the wireless communication scenario shown in FIG. 1 is another wireless communication scenario, the primary node and the secondary node may alternatively be other possibilities. Examples are not listed one by one herein in this application.

It should be noted that quantities of the primary nodes and the secondary nodes shown in FIG. 1 are merely examples. In the wireless communication scenario, more or fewer nodes may alternatively be included. This is not limited in this application.

It should be understood that the node in this application may alternatively be another description like a communication node, a device (an apparatus), or a communication device (apparatus).

Currently, the wireless communication scenario usually includes a plurality of communication domains, and the plurality of communication domains exist densely. Because the communication domains work independently, there may be mutual interference between the communication domains. This imposes a higher requirement on anti-interference performance of a wireless communication technology. Application types become increasingly rich. This also imposes higher requirements for a maximum transmission rate of wireless communication and flexible adjustment of a transmission rate. However, currently, when a signal is transmitted by using a frame structure in a binary Gaussian frequency-shift keying (GFSK) modulation scheme, anti-noise and anti-interference performance is poor, and signal transmission may fail. In addition, each symbol in the frame structure in the binary GFSK modulation scheme carries one-bit (post-encoding) information, and a transmission rate cannot be adjusted in a modulation scheme, and can be adjusted only by using an encoding code rate and a symbol rate, resulting in poor flexibility.

Based on this, this application provides a signal transmission method and apparatus, to improve anti-noise and anti-interference performance during signal transmission, and improve flexibility of adjusting the transmission rate.

It should be noted that in embodiments of this application, a signal can be sent by a signal transmit end, a processor in a signal transmit end, a chip or a chip system, a function module, or the like. A signal can be received by a signal receive end, a processor in a signal receive end, a chip or a chip system, a function module, or the like. In the following embodiments, the signal transmission method provided in this application is described in detail merely by using an example in which the signal receive end is the first device and the signal receive end is the second device. However, this is not limited in this application.

Figure 2:
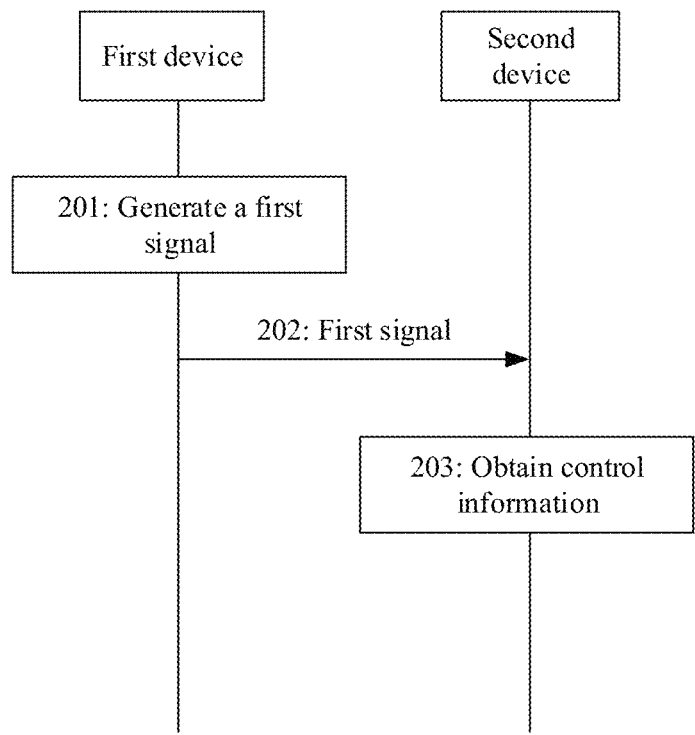
FIG. 2 is a flowchart of a signal transmission method according to this application.

Based on the foregoing descriptions, a signal transmission method provided in an embodiment of this application is applicable to the scenario shown in FIG. 1. Refer to FIG. 2. A procedure of the method may include the following operations.

Operation 201: A first device generates a first signal, where the first signal may include a first part and a second part. The second part may be modulated in a phase shift keying (PSK) modulation scheme, the second part may be encoded by using polar code, the first part may be used to transmit a preconfigured sequence, a predefined sequence, or a sequence generated according to a predefined rule, and the second part may be used to transmit control information.

The control information in the first signal is modulated in the PSK modulation scheme and encoded by using the polar code. This can improve receiving sensitivity of a signal receive end to the control information, and can improve anti-noise and anti-interference performance. The control information is modulated in the PSK modulation scheme and encoded by using the polar code. This can improve accuracy of receiving the control information by the signal receive end, and can improve reliability of content indicated by the control information, for example, improve reliability of a modulation and coding scheme, a length, and the like of transmission data that are indicated by the control information, so that the signal receive end can filter out unnecessary information, to ensure that data is correctly received, and ensure reliability of data transmission.

For example, the PSK modulation scheme may include a binary phase shift keying (BPSK) modulation scheme, a quadrature phase shift keying (QPSK) modulation scheme, an 8 phase shift keying (8PSK) modulation scheme, or the like. The PSK modulation scheme may further include a modulation scheme derived from a combination of the foregoing modulation schemes and a technology like a differential technology, for example, differential quadrature phase shift keying (DQPSK) modulation or differential phase shift keying (DPSK) modulation.

The performing modulation in the PSK modulation scheme means performing modulation in one of the plurality of PSK modulation schemes. It should be noted that modulation schemes used by the first device (namely, the signal transmit end) to generate different signals may be the same or different. This is not limited in this application.

In one embodiment, the first part may be modulated in the PSK modulation scheme. For a PSK modulation scheme, refer to the foregoing descriptions of the PSK modulation scheme. Details are not described herein again. It should be noted that, the first part and the second part may be modulated in a same modulation scheme or different modulation schemes. For example, both the first part and the second part are modulated in the BPSK modulation scheme. For another example, the first part is modulated in the BPSK modulation scheme, and the second part is modulated in the QPSK modulation scheme. It should be understood that the foregoing example is merely an example. This is not limited in this application.

When modulation is performed in the PSK modulation scheme, compared with the GFSK modulation scheme, the PSK modulation scheme can improve receiving sensitivity of the receive end, and improve anti-noise and anti-interference capabilities. A plurality of types of the PSK modulation schemes are supported. A quantity of post-encoding bits that can be carried in a single symbol can be adjusted, to flexibly adjust a rate. In addition, a maximum quantity of bits that can be carried in the single symbol is increased, to increase a peak rate. The second part is encoded by using the polar code. This can improve receiving sensitivity of the signal receive end to information carried in the second part, and improve anti-noise and anti-interference performance. In addition, a coding gain obtained by changing instead of repeating the code rate is greater than a loss caused by increased interference due to use of more resources by all devices in a congestion scenario, so that the changing is applicable to a high-density and strong-interference scenario.

The first part may be referred to as a sequence part or another name. The first part may carry a sequence known to both the signal transmit end and the signal receive end, and is used to implement functions such as synchronization, channel estimation, and AGC. For example, the first part may be further used to implement functions such as symbol rate identification and interference signal filtering.

In embodiments of this application, a sequence may be a group of numbers that are known to the signal transmit end and the signal receive end before signal transmission and that have a sequential relationship. For example, a type of the number may be a "0"- or "1"-bit type, a real number, a complex number, an integer, or another type. This is not limited in this application.

For example, before signal transmission, manners of determining the sequence known to the signal transmit end and the signal receive end may be as follows:

(1) The sequence is predefined. For example, the sequence is specified in a protocol, specified in a regulation, or specified in an industry standard.

(2) The sequence is pre-configured. For example, the sequence may be configured by using signaling transmitted before the sequence is transmitted. In an embodiment, the sequence may be configured for the transmit end and the receive end of the sequence by using a wireless communication technology described in this application or another technology other than the wireless communication technology. The another technology may be a wired communication technology or another wireless communication technology, or may be a manner like a configuration interface, a configuration jumper, or configuration software reserved by a device.

(3) The sequence is generated according to a predefined rule. For example, a generation rule of the sequence is specified in a protocol, a regulation, an industry standard, or the like. A transmit end and a receive end of the sequence generate the sequence according to the rule.

(4) The sequence is generated according to the predefined rule based on a predefined and/or preconfigured parameter.

(5) A plurality of sequences generated in at least one of the foregoing manners (1) to (4) are combined according to a predefined rule to generate the sequence. The combination rule herein may be arranging based on the predefined sequence, or calculating and rearranging numbers in the plurality of sequences according to a predefined rule. For example, a number in the predefined sequence is sequentially multiplied by a predefined spreading/time-spreading sequence, and the sequence is obtained through sequential arrangement.

It should be understood that, in addition to the foregoing manners, the sequence known to both the receive end and the transmit end before the signal is transmitted may be determined in another manner. This is not limited in this application.

For example, the sequence is usually used for synchronization, channel estimation and measurement, automatic gain control (AGC), ranging positioning, and the like.

For example, the first part may successively include a preamble sequence and at least one first sequence. The first sequence may include an M-sequence and/or a second sequence. The second sequence may be a sequence generated based on an identifier of a first device and/or a sequence generated based on an identifier of a link of the first device. In this way, synchronization and channel estimation performance at the signal receive end (namely, the second device) can be improved. A side lobe of an autocorrelation function of the M-sequence is small, and a probability of errors occurring in synchronization and channel estimation is low. Therefore, the M-sequence has excellent synchronization and channel estimation performance at a low signal to interference plus noise ratio. Because identifiers of different devices and/or identifiers of different links are usually different, sequences generated based on the identifiers of the different devices and/or the identifiers of the different links are usually different, that is, the second sequence in an effective signal is different from the second sequence in the interference channel. Therefore, the second sequence has an additional effect of filtering interference.

The second device knows the identifier of the first device before receiving the signal, and the second device may determine the first device (namely, the signal transmit end) based on the identifier of the first device, to determine the known sequence in the first part of the first signal sent by the first device.

In one embodiment, the first part may further include a signal that does not carry information. For example, the signal is located before the sequence included in the first part in time domain. For example, the signal may be a predefined constant modulus signal. This is not limited in this application.

In one embodiment, a length of the preamble sequence included in the first part may be related to a symbol rate for transmitting the preamble sequence. In a plurality of times of signal transmission, when different symbol rates are used to transmit the preamble sequence in the plurality of times of signal transmission, time lengths for transmitting the preamble sequence in the plurality of times of signal transmission are the same. For example, when the symbol rate is 1 megahertz (MHz), a length of the preamble sequence may be 8 bits; when the symbol rate is 2 MHz, a length of the preamble sequence may be 16 bits; or when the symbol rate is 4 MHz, a length of the preamble sequence may be 32 bits. In the foregoing three cases, if the preamble sequences are all modulated in the BPSK modulation scheme, one symbol is mapped to one bit, and a time length for transmitting the preamble sequence is 8 microseconds (μs). If the preamble sequences are all modulated in the QPSK modulation scheme, one symbol is mapped to two bits, and a time length for transmitting the preamble sequence is 4 μs. For another example, when the symbol rate is 1 MHz, a length of the preamble sequence may be 10 bits; when the symbol rate is 2 MHz, a length of the preamble sequence may be 20 bits; or when the symbol rate is 4 MHz, a length of the preamble sequence may be 40 bits. In the foregoing three cases, if the preamble sequences are all modulated in the BPSK modulation scheme, a time length for transmitting the preamble sequence is 10 μs. If the preamble sequences are all modulated in the QPSK modulation scheme, one symbol is mapped to two bits, and a time length for transmitting the preamble sequence is 5 μs. It should be understood that the foregoing example is merely an example. This is not limited in this application.

The preamble sequence is mainly used by the signal receive end to perform automatic gain control. A time period required for automatic gain control is irrelevant to the symbol rate, and time lengths for transmitting the preamble sequence at different symbol rates are the same (for example, the time lengths are all 8 μs). In this way, implementation of a device is simplified, and a resource waste can be avoided.

The first part may include one or more M-sequences whose lengths are 31 bits, or the first part may include at least one M-sequence whose length is 63 bits. When a quantity of M-sequences of a length (for example, 31 bits) is greater than one, content of a plurality of M-sequences of a same length is different. An M-sequence or M-sequences to be used may be specified in a protocol, or may be preconfigured by a primary node. When the primary node preconfigures the M-sequence, there is a high probability that the M-sequence in a signal source is different from that in an interference source. This helps the signal receive end distinguish between a signal and interference in an interference scenario, and also helps reduce channel estimation performance deterioration at the signal receive end caused by the interference, thereby improving transmission performance.

It should be understood that the M-sequence (m sequence) may be a most basic pseudo-noise (PN) sequence used in a code division multiple access (CDMA) system. The M-sequence may be a maximum-length code sequence generated by a multi-level shift register or a delay element of the multi-level shift register through linear feedback. The M-sequence may be an abbreviation of a maximum-length linear-feedback shift register sequence.

The first part may include at least one sequence generated based on the identifier of the first device and/or at least one sequence generated based on the identifier of the link of the first device. The sequence in the signal source is almost always different from that in the interference source. This helps the signal receive end distinguish between a signal and interference in an interference scenario, and helps reduce channel estimation performance deterioration at the signal receive end caused by the interference, thereby improving transmission performance.

In one embodiment, a length of the sequence (namely, the second sequence) may be 24 bits or 32 bits.

That the second sequence may be the sequence generated based on the identifier of the first device may be: The second sequence may be a sequence corresponding to the identifier of the first device. Alternatively, the second sequence may be a sequence in which a sequence corresponding to the identifier of the first device is generated through encoding by using the polar code at a preset code rate. Alternatively, the second sequence may be a part of a sequence corresponding to the identifier of the first device. Alternatively, the second sequence may be a sequence in which a part of a sequence corresponding to the identifier of the first device is generated through encoding by using the polar code at a preset code rate.

That the second sequence may be the sequence generated based on the identifier of the link of the first device may be: The second sequence may be a sequence corresponding to the identifier of the link of the first device. Alternatively, the second sequence may be a sequence in which a sequence corresponding to the identifier of the link of the first device is generated through encoding by using the polar code at the preset code rate. Alternatively, the second sequence may be a part of a sequence corresponding to the identifier of the link of the first device. Alternatively, the second sequence may be a sequence in which a part of a sequence corresponding to the identifier of the link of the first device is generated through encoding by using the polar code at the preset code rate.

In one embodiment, when the second sequence is generated through encoding by using the polar code at the preset code rate, an encoding part does not include other information, to ensure that the second sequence is a sequence known to the signal receive end (namely, the second device).

It should be noted that the identifier of the first device or the identifier of the link may be represented by using a binary number, and a bit sequence formed by the binary number is the sequence corresponding to the identifier of the first device or the identifier of the link.

In one embodiment, the identifier of the link of the first device may be an access address of the first device or the like.

In one embodiment, a part of the sequence corresponding to the identifier of the first device may be low H bits of the sequence corresponding to the identifier of the first device, or even bits of the sequence corresponding to the identifier of the first device, or may be another possible part, where H is an integer greater than or equal to 1.

Similarly, a part of the sequence corresponding to the identifier of the link of the first device may be low K bits of the sequence corresponding to the identifier of the link of the first device, or even bits of the sequence corresponding to the identifier of the link of the first device, or may be another possible part, where K is an integer greater than or equal to 1.

When the second sequence is a part of the sequence corresponding to the identifier of the first device or the identifier of the link, additional overheads caused by an excessively long sequence corresponding to the identifier of the first device or the identifier of the link can be reduced. When the second sequence is generated through encoding by using the polar code at the preset code rate, synchronization or channel estimation performance deterioration caused by an insufficient length of the sequence corresponding to the identifier of the first device or the identifier of the link can be avoided. In addition, through coding protection, the sequence corresponding to the identifier of the first device or the identifier of the link can still be correctly identified at a low signal to interference plus noise ratio, so as to reduce a probability that a valid data packet is discarded during filtering of transmission data because the sequence corresponding to the identifier of the first device or the link is incorrectly identified.

It should be understood that a time domain location of the preamble sequence included in the first part is before a time domain location of the at least one first sequence. In other words, when sending the first part of the first signal, the first device first sends the preamble sequence and then sends the at least one first sequence. When the at least one first sequence is a plurality of sequences, a time domain order of the plurality of first sequences is not limited.

It should be noted that, when the first device sends the first signal, the first part transmitted is actually a signal obtained after a corresponding sequence is modulated in a modulation scheme.

In one embodiment, the first part may include two same sequences. In other words, two same sequences may exist in the sequences included in the first part. It should be understood that, that three or more sequences in the sequences included in the first part are the same also belongs to a case in which the first part includes two same sequences. Certainly, another possible case is similar. This is not limited in this application. This improves frequency synchronization precision and reduces complexity of a frequency synchronization algorithm.

In one embodiment, the first signal may further include a data part, and the data part may be modulated in the PSK modulation scheme. It should be noted that modulation schemes of the data part, the first part, and the second part may be the same, or may be partially the same, or may be completely different. For example, the data part, the first part, and the second part are all modulated in the BPSK modulation scheme. For another example, the data part and the first part are modulated in the BPSK modulation scheme, and the second part is modulated in the QPSK modulation scheme. For another example, the data part is modulated in the 8PSK modulation scheme, the first part is modulated in the BPSK modulation scheme, and the second part is modulated in the QPSK modulation scheme. It should be understood that the foregoing example is merely an example. This is not limited in this application.

The data part may be part of the first signal, and may be used for transmission of service data and/or control signaling. A length of the data part is variable. For example, the length (a quantity of symbols) of the data part may be determined based on a modulation and coding scheme indicated by the control information and a valid information length before encoding. The valid information length may change, for example, between 1 to 255 bytes or between 1 to 2047 bytes. In one embodiment, when the control information indicates that the valid information length is 0, the first signal does not include the data part.

In one embodiment, a time domain location of the data part is after a time domain location of the second part. When sending the first signal, the first device sends the data part after sending the second part. It should be understood that this is merely an embodiment, and a sequence of the second part and the data part in time domain is not limited in this application.

It should be noted that, when the first signal is used to send a null packet, the first signal does not include the data part, and when data needs to be sent, the data part needs to be included.

In one embodiment, symbol rates of at least two of the first part, the second part, and the data part may be the same. This can reduce overheads of a switching interval. In addition, this is easy to implement.

For example, a symbol rate of the data part may be 1 megahertz (MHz), 2 megahertz, 4 megahertz, or another rate. A higher symbol rate may bring a higher peak rate.

It should be noted that a symbol rate set can be specified in a protocol, and the symbol rate set may include at least symbol rates of 1 MHz, 2 MHz, and 4 MHz. Each time the first device sends a signal, a symbol rate of a data part in the signal may be a symbol rate in the symbol rate set, and symbol rates of data parts in signals sent a plurality of times may be the same or different. This is not limited in this application. MHz may alternatively be described as M symbols per second.

In one embodiment, the second part may be encoded by using a first modulation scheme and a first code rate, where the first modulation scheme may be one of the PSK modulation schemes, the first modulation scheme may be preconfigured or predefined, and the first code rate may be preconfigured, predefined, or determined according to a predefined rule; the first modulation scheme may be selected based on a first set, the first code rate may be selected based on the first set, and the first set may indicate at least one combination of a modulation scheme and a code rate; or the first modulation scheme may be selected based on a second set, the second set may indicate at least one modulation scheme, the first code rate may be selected based on a third set, and the third set may indicate at least one code rate. In this way, only one rate or fewer code rates can be specified, thereby reducing implementation complexity of decoding the second part.

That the first set indicates at least one combination of a modulation scheme and a code rate may be: The first set includes the at least one combination of a modulation scheme and a code rate, or the first set includes information indicating the at least one combination of a modulation scheme and a code rate. That the second set indicates at least one modulation scheme may be: The second set includes the at least one modulation scheme; or the second set includes information indicating the at least one modulation scheme. That the third set indicates at least one code rate may be: The third set includes the at least one code rate; or the third set includes information indicating the at least one code rate.

The predefined first code rate may be the first code rate specified in a protocol.

In one embodiment, one modulation scheme and one code rate are specified in the protocol, and all sent second parts use the modulation scheme and the code rate. In other words, the first modulation scheme and the first code rate are a modulation scheme and a code rate that are specified in the protocol.

In one embodiment, F modulation schemes and N code rates are specified in the protocol, and F and N are positive integers. Each time the signal transmit end sends a signal, one of the F modulation schemes is used as a modulation scheme of the second part, and one of the N code rates is used as a code rate. In an embodiment, during one time of signal transmission, a modulation scheme and a code rate to be used may be preconfigured (in other words, the first modulation scheme and the first code rate are a preconfigured modulation scheme and code rate, which may also be understood as that the first modulation scheme is preconfigured based on the second set (the F modulation schemes), and the first code rate is preconfigured based on the third set (the N code rates)). For example, before the signal is sent, the modulation scheme and the code rate are configured by using signaling. The signaling may be scheduling signaling, connection establishment signaling, other signaling, or the like. This is not limited in this application. For another example, the modulation scheme and code rate may be determined based on at least one type of information such as a link type, a transmission type, a signal receive end type, and/or a signal transmit end type.

In one embodiment, F modulation schemes and N code rates are specified in the protocol. In this case, the F modulation schemes are the second set, and the N code rates are the third set. The signal transmit end may select a modulation scheme and a code rate to be used, and use the sequence part to indicate the modulation scheme and the code rate. In other words, the first modulation scheme is one modulation scheme in the second set, and the first code rate is one code rate in the third set. Methods for selecting a modulation scheme and determining a code rate may be the same or different.

In one embodiment, L combinations (namely, L combinations of modulation schemes and code rates) are specified in the protocol, and L is a positive integer. Each time the signal transmit end sends a signal, the second part is modulated and encoded by using one of the L combinations. In an embodiment, during one time of signal transmission, a combination to be used may be preconfigured (which may also be understood as that the first modulation scheme and the first code rate are preconfigured based on the first set (the L combinations of modulation schemes and code rates)). For example, before the signal is sent, the combination is configured by using signaling. The signaling may be scheduling signaling, connection establishment signaling, other signaling, or the like. For another example, the combination may be determined based on at least one type of information such as a link type, a transmission type, a signal receive end type, and/or a signal transmit end type.

In one embodiment, L combinations (namely, L combinations of modulation schemes and code rates) are specified in the protocol. In this case, the L combinations are the first set. The signal transmit end may select a combination to be used, and use the sequence part to indicate the combination. In other words, the first modulation scheme and the first code rate are a combination in the first set.

In another manner other than the first manner in which only one modulation scheme and one code rate are specified, redundancy can be increased at a low signal-to-noise ratio to implement better anti-noise and anti-interference performance, and redundancy can be reduced at a high signal-to-interference-noise ratio to reduce overheads.

When the first code rate is determined according to the predefined rule, an embodiment method may be that content and a length (a length or a total length of each field of the specified content) before encoding and a length after encoding are specified in the protocol, so that the first code rate is determined by using the content or the length before and after encoding. For example, a plurality of formats of the control information and at least one quantity of post-encoding bits are specified in the protocol, or a combination of a plurality of formats of the control information and a quantity of post-encoding bits is specified in the protocol.

It should be noted that, the code rate specified in the foregoing protocol may be directly explicitly specified, or may be implicitly indicated. This is not limited in this application.

In one embodiment, a first correspondence is predefined (for example, specified in the protocol). The first correspondence is a correspondence between a symbol rate of at least one part of the first signal or frequency hopping channel bandwidth for transmitting the first signal and a modulation scheme and/or a code rate of the second part. Further, by using the first correspondence, the signal transmit end may determine the first modulation scheme and/or the first code rate of the second part based on the symbol rate or the frequency hopping channel bandwidth for sending. The symbol rate or the frequency hopping channel bandwidth for sending may be preconfigured by using signaling, or may be selected by the signal transmit end. This is not limited in this application. Generally, a high symbol rate or large bandwidth is applicable to a scenario at a high signal-to-noise ratio, and a transmission reliability requirement of the second part can be met by using high-order modulation and a high code rate in the scenario at the high signal-to-noise ratio. A low symbol rate or narrow bandwidth is applicable to a scenario at a low signal-to-noise ratio, and a reliability requirement of the second part can be met by using low-order modulation and a low code rate in the scenario at the low signal-to-noise ratio. The first correspondence is predefined, so that scenarios at different signal-to-noise ratios can be effectively adapted, and signaling or a signaling procedure can be simplified to reduce overheads.

In a possible implementation, the first part may indicate the first modulation scheme and/or the first code rate. In this way, blind decoding of the second part can be avoided.

In one embodiment, when the first part indicates the first modulation scheme and/or the first code rate, different sequences, different modulation schemes, different symbol rates, and the like may be used to implicitly indicate the first modulation scheme and/or the first code rate.

For example, whether the first part includes the second sequence, whether the first part includes the M-sequence, different second sequences in a plurality of times of transmission, different M-sequence lengths or characteristic polynomials in a plurality of times of transmission, and different preamble sequences in a plurality of times of transmission may be used to implicitly indicate a modulation scheme and/or a code rate that need to be used for the second part in each transmission. Different modulation and coding schemes of the second part adapt to different signal to interference plus noise ratio conditions, and corresponding synchronization and channel estimation performance requirements are also different. Therefore, the different modulation and coding schemes correspond to different types of sequence parts. For example, the first part includes or does not include the second sequence or generates the second sequence at different code rates, so as to balance an anti-interference capability and overheads. The first part includes or does not include the M-sequence, so as to balance an anti-noise capability and overheads. Different lengths of the M-sequences can balance overheads at different signal-to-noise ratios.

In one embodiment, the second part may include a cyclic redundancy check bit (CRC). In this way, reliability of the control information can be improved.

The second part may be referred to as a control part or another name. Before encoding, the second part may include 44 bits, where the control information of the second part may include 20 bits, and the second part may further include the cyclic redundancy check bit of 24 bits. Alternatively, before encoding, the second part may include 51 bits, where the control information may be 27 bits, and the cyclic redundancy check bit is 24 bits. After encoding, the second part may be 128 bits or 192 bits. It should be understood that the foregoing is merely a possible example. This is not limited in this application.

In one embodiment, the second part may be scrambled by using a third sequence, or the cyclic redundancy check bit may be scrambled by using the third sequence. The third sequence may be a sequence generated based on the identifier of the first device and/or a sequence generated based on the identifier of the link of the first device. In this way, interference data can be filtered out without increasing resource overheads.

In one embodiment, the third sequence may be the same as the second sequence, or may be different from the second sequence. This is not limited in this application.

For example, the data part may be encoded by using the polar code. In this way, anti-interference performance of the data part can be improved.

Specifically, the second part may indicate a code rate for polar code encoding or whether the data part is encoded by using the polar code. For example, the control information of the second part may include information indicating the code rate for polar code encoding or whether the data part is encoded by using the polar code, so that the second part indicates the code rate for polar code encoding or whether the data part is encoded by using the polar code. In this way, blind detection on the data part can be avoided, and a plurality of code rates can be flexibly implemented for the data part.

In one embodiment, the information that is included in the second part (for example, the control information of the second part) and that indicates whether the data part is encoded by using the polar code may be one bit. In other words, the second part may indicate, by using one bit, whether the data part is encoded by using the polar code. For example, if the one-bit information is "0", it may indicate that the data part is encoded by using the polar code, and if the one-bit information is "1", it may indicate that the data part is not encoded by using the polar code. For another example, if the one-bit information is "1", it may indicate that the data part is encoded by using the polar code, and if the one-bit information is "0", it may indicate that the data part is not encoded by using the polar code.

In one embodiment, the second part may indicate a modulation scheme of the data part. For example, the control information of the second part may include information indicating the modulation scheme of the data part, so that the second part indicates the modulation scheme of the data part. In this way, blind detection on the data part can be avoided, and the data part can be flexibly selected in more modulation schemes.

In one embodiment, the second part may further indicate a combination of a modulation scheme and a code rate of the data part. For example, the control information of the second part may include information indicating the combination of the modulation scheme and the code rate of the data part.

In one embodiment, the information that is included in the second part (for example, the control information of the second part) and that indicates the combination of the modulation scheme and the code rate of the data part may be four bits. In other words, the second part may indicate the combination of the modulation scheme and the code rate of the data part by using four bits. For example, a set of combinations of modulation schemes and code rates may be predefined in a protocol or specified in a protocol. The foregoing four-bit information indicates that the combination of the modulation scheme and the code rate is a combination of a modulation scheme and a code rate in the set.

For example, the modulation scheme and the code rate (namely, an encoding code rate, which may also be referred to as an encoding rate or the like) of the data part may form a modulation and coding scheme (MCS). The modulation and coding scheme MCS that includes the modulation scheme and the code rate of the data part may be one MCS in a preset MCS set. For example, the preset MCS set may be represented in a form of a table, for example, as shown in Table 1.

TABLE 1

| Modulation and coding scheme index | Modulation scheme | Code rate |
| --- | --- | --- |
| 0 | BPSK | 3/8 |
| 1 | QPSK | 1/4 |
| 2 | QPSK | 3/8 |
| 3 | QPSK | 1/2 |
| 4 | QPSK | 5/8 |
| 5 | QPSK | 3/4 |
| 6 | QPSK | 7/8 |

TABLE 1-continued

| Modulation and coding scheme index | Modulation scheme | Code rate |
|---|---|---|
| 7 | 8PSK | 5/8 |
| 8 | 8PSK | 3/4 |
| 9 | 8PSK | 7/8 |
| 10 | 8PSK | 1 |

In one embodiment, the second part may indicate length information of the data part. For example, the control information of the second part may include the length information of the data part, so that the second part indicates the length information of the data part. In this way, blind detection on the data part can be avoided, and a length of the data part can be flexible and variable.

For example, the length information of the data part may be a pre-encoding length of a payload of the data part, a pre-encoding length of the entire data part, a post-encoding length of the entire data part, a quantity of symbols obtained after the entire data part is encoded and modulated, a time length of the data part, a time length of the entire first signal (lengths of the first part and the second part are fixed values, and therefore may indirectly indicate a length of the data part), or other length information. This is not limited in this application.

In one embodiment, the information that is included in the second part (for example, the control information of the second part) and that indicates the length information of the data part may be eight bits or 11 bits. In other words, the second part may indicate the length information of the data part by using eight bits or 11 bits. For example, when the length information of the data part is the pre-encoding length of the data part, the second part may indicate the pre-encoding length of the data part by using the 8-bit information or the 11-bit information. For example, the length may be a quantity of bytes.

In one embodiment, when the second part indicates the pre-encoding length of the data part by using the 8-bit information, the first signal may be transmitted in a connectionless transmission mode; or the first signal is transmitted in a broadcast manner, that is, the first signal is a broadcast signal, and a receive end of the first signal does not feed back information for the first signal. In other words, when the first signal is transmitted in the connectionless transmission mode or is a broadcast signal, the second part may indicate the pre-encoding length of the data part by using the 8-bit information.

In one embodiment, the second part may indicate at least one of the following: a number (which may also be referred to as a sequence number, an identifier, or the like) of transmission data of the data part, a number of a protocol data unit (PDU) of the data part, a number of a payload in the PDU, whether the transmission data is retransmitted, whether the PDU is retransmitted, or whether the payload in the PDU is retransmitted. In this way, the signal receive end can implement retransmission combination accordingly, and can filter out data that has been correctly received or does not need to be received. For example, the control information of the second part may include the foregoing numbers or corresponding indication information indicating whether retransmission is performed, so that the indication of the second part is implemented. For example, when the second part indicates whether the transmission data is retransmitted, the control information of the second part may include the indication information indicating whether the transmission data is retransmitted, so that the second part indicates whether the transmission data is retransmitted. Other indication cases are similar, and are not enumerated one by one herein.

It should be noted that, in this application, the indication information indicating whether retransmission is performed may also be referred to as new and old indication information, that is, indicates whether new transmission or retransmission is performed.

In one embodiment, the second part (for example, the control information of the second part) may indicate the number of the transmission data in the data part, the number of the PDU of the data part, or the number of the payload in the PDU by using the 1-bit information. For example, when a data packet currently sent is the same as a data packet sent last time (or transmission in a same order in a previous transmission period), or a data packet currently sent is a retransmitted data packet of a data packet sent last time (or transmission in a same order in a previous transmission period), the second part may use a same number as last time (or transmission in a same order in a previous transmission period) (in other words, the number of the current time indicated by the 1-bit information remains unchanged compared with the number of the previous time); otherwise, a different number may be used (in other words, the number of the current time indicated by the 1-bit information changes compared with the number of the previous time).

In one embodiment, the second part may indicate at least one of the following: feedback information of transmission data of a second device, feedback information of a PDU of the second device, feedback information of a payload in the PDU of the second device, a number (which may also be referred to as a sequence number, an identifier, or the like) of data expected to be transmitted by the second device next time, a number of a PDU expected to be transmitted by the second device next time, a number of a payload in the PDU expected to be transmitted by the second device next time, whether the data expected to be transmitted by the second device next time is retransmitted, whether the PDU expected to be transmitted by the second device next time is retransmitted, or whether the payload in the PDU expected to be transmitted by the second device next time is retransmitted. In this way, the signal receive end can determine whether new data or old data should be transmitted next time, or determine whether data transmitted last time has been correctly received. For example, the control information of the second part may include the foregoing corresponding information or information indicating the corresponding information, so that the indication of the second part is implemented. For example, the control information of the second part includes the feedback information of the transmission data of the second device, so that the second part may indicate the feedback information of the transmission data of the second device. For another example, the control information of the second part includes information about whether the data expected to be transmitted by the second device next time is retransmitted, so that the second part may indicate whether the data expected to be transmitted by the second device next time is retransmitted. Other indication cases are similar, and are not enumerated one by one herein.

For example, the feedback information may be a feedback indicating whether the transmission is correct or incorrect, for example, acknowledgment (ACK) information or negative acknowledgment (NACK) information.

In an example, the second part (for example, the control information of the second part) may indicate, by using the 1-bit information, the feedback information of the transmission data, the PDU, or the payload in the PDU of the second device, or the number of the data, the PDU, or the payload in the PDU expected to be transmitted by the second device next time.

In another example, the second part (for example, the control information of the second part) may indicate, by using the 8-bit information, feedback information of data, a PDU, or a payload in a PDU transmitted by the second device eight times at most, or a number of data, a PDU, or a payload in a PDU expected to be transmitted by the second device eight times at most. One of the eight bits indicates feedback information of data, a PDU, or a payload in a PDU transmitted by the second device at a time, or a number of data, a PDU, or a payload in a PDU expected to be transmitted by the second device at a later time. It should be noted that in this example, an example of the eight bits is merely an example, and corresponding information may be indicated by using four bits four times at most, or certainly, may be indicated by another quantity of bits. This is not limited in this application. It should be understood that in this example, the corresponding information indicated by using the eight bits eight times at most may also correspond to eight times for a plurality of devices, and is not limited to eight times for the second device.

According to the indication of the second part, that is, the number of the data transmitted this time or the new and old indication information, the feedback information about whether data received last time is correctly received, the number of the data expected to be transmitted next time, the information about whether the data is retransmitted, or the like that is indicated by the second part, the signal receive end may perform hybrid automatic repeat request (HARQ) retransmission combination on the data part, so as to improve anti-noise and anti-interference capabilities.

In one embodiment, the second part may indicate whether the data part exists, indicate whether the data part includes the PDU, or indicate whether the payload in the PDU of the data part is null. For example, the control information of the second part may include information indicating the forego-ing information, so that the indication of the second part is implemented. For example, in an indication manner, a special status of a length field may be used to indicate a null packet, for example, an indication length of 0 or an indica-tion length of a value that exceeds a length range specified in a protocol indicates a null packet. In this way, the signal receive end can be prevented from performing unnecessary decoding on a null packet, so as to reduce receiving power consumption.

In one embodiment, the second part may indicate at least one of the following: a type of data in the data part, a type of the PDU in the data part, a type of the payload of the PDU in the data part, grouping information of data in the data part, grouping information of the PDU in the data part, or grouping information of the payload of the PDU in the data part. For example, the control information of the second part may include the foregoing information, so that the indication of the second part is implemented. In this way, the signal receive end can receive and respond to only data related to the signal receive end, so as to reduce receiving power consumption.

For example, the foregoing type may be control, data, whether control information is included, whether data infor-mation is included, or the like. For another example, the type may alternatively be the following case: A high-layer large data packet is split into a plurality of small data packets for sending, or a sent small data packet is a first data packet, a last data packet, or an intermediate data packet in the plurality of small data packets into which the high-layer large data packet is split.

For example, the grouping information may be a data type temporarily allocated based on an application, a service, or the like. For example, map service data is classified into a data group 1, and weather service data is classified into a data group 2. Alternatively, data related to a first application is classified into a data group 1, and data related to a second application is classified into a data group 2. It should be understood that the grouping information may alternatively be another explanation. This is not limited in this applica-tion.

In one embodiment, when the second part (for example, the control information of the second part) indicates the grouping information of the data in the data part, the grouping information of the PDU in the data part, or the grouping information of the payload of the PDU in the data part, a data group in which the data, the PDU, or the payload of the PDU in the data part is located may be indicated by using 3-bit information, and then a sequence number of the data, the PDU, or the payload of the PDU in the data part in the data group may be indicated by using 5-bit information. In one embodiment, the second part (for example, the control information of the second part) may further indicate, by using 1-bit information, whether the data, the PDU, or the payload of the PDU in the data part is the last one in the data group.

For example, when the first signal is a broadcast signal, the second part (for example, the control information of the second part) may indicate, by using the foregoing bits, the grouping information of the data in the data part, the grouping information of the PDU in the data part, or the grouping information of the payload of the PDU in the data part.

In one embodiment, the data part may also include the CRC used to check data or a PDU, to improve reliability of data transmission.

In one embodiment, the first signal is used for broadcast, the second part may include type information of the broad-cast, and the type information of the broadcast may include at least one of the following: whether the broadcast can be scanned, whether the broadcast can be connected, whether the broadcast can be used for directional transmission, or whether the broadcast can be used for non-directional trans-mission. In this way, the signal receive end can receive and respond to only data related to the signal receive end, so as to reduce receiving power consumption.

In one embodiment, the type information of the broadcast may be included in the control information of the second part.

In one embodiment, the second part may indicate whether to continue to send data by using a currently allocated or currently used resource or resource unit, and/or may indicate whether to continue to receive data by using the currently allocated or currently used resource or resource unit. In this way, resource control (negotiation) information can be trans-mitted by using a most reliable resource, so that a consensus is most quickly reached on avoiding unnecessary transmis-sion as much as possible, so as to save resources and reduce power consumption. For example, the foregoing indication may be implemented by using the control information of the second part.

In one embodiment, the second part (for example, the control information of the second part) may indicate, by using 1-bit information, whether to continue to send data by using the currently allocated or currently used resource or resource unit. For example, if the 1-bit information is "0", it may indicate that the currently allocated or currently used resource or resource unit is used to continue to send data, and if the 1-bit information is "1", it may indicate that the currently allocated or currently used resource or resource unit is not used to continue to send data. For another example, if the 1-bit information is "1", it may indicate that the currently allocated or currently used resource or resource unit is used to continue to send data, and if the 1-bit information is "0", it may indicate that the currently allocated or currently used resource or resource unit is not used to continue to send data.

Whether to continue to send data by using the currently allocated or currently used resource or resource unit may include the following case: The currently allocated resource or resource unit or the currently used resource or resource unit still has sufficient resources for sending data, but no longer sends data; or the currently allocated resource or resource unit or the currently used resource or resource unit does not have sufficient resources for sending data, and no longer sends data. Similarly, whether to continue to receive data by using the currently allocated or currently used resources or resource units may include the following case: The currently allocated resource or resource unit or the currently used resource or resource unit still has sufficient resources for receiving data, but no longer receives data; or the currently allocated resource or resource unit or the currently used resource or resource unit does not have sufficient resources for receiving data, and no longer receives data.

For example, that the currently allocated resource or resource unit or the currently used resource or resource unit no longer sends data may indicate that the currently allocated resource or resource unit or the currently used resource or resource unit no longer sends new data, but still retransmits current data before determining that the current data is correctly received; or the currently allocated resource or resource unit or the currently used resource or resource unit no longer sends any data. That the currently allocated resource or resource unit or the currently used resource or resource unit no longer receives data may indicate that the currently allocated resource or resource unit or the currently used resource or resource unit no longer receives new data, but still receives the retransmitted data before determining that the current data is correctly sent; or the currently allocated resource or resource unit or the currently used resource or resource unit no longer receives any data.

For example, the resource unit may be an event, a sub-event, a timeslot, a frame, a radio frame, a subframe, a superframe, or the like.

In one embodiment, the second part may indicate whether there is data to be sent. In other words, the second part may indicate whether to continue to send data. For example, the control information of the second part may indicate whether there is the data to be sent. The to-be-sent data is new data. In this way, the signal transmit end (namely, the first device) can negotiate a subsequent transmission policy with the signal receive end (namely, the second device), to quickly reach a consensus on avoiding unnecessary transmission as much as possible, so as to save resources and reduce power consumption.

In one embodiment, the second part may indicate whether data can continue to be received. For example, the control information of the second part may indicate whether the data can continue to be received. In this way, the signal receive end (namely, the second device) can stop sending subsequent data in time, to save resources and reduce power consumption.

Whether the data can continue to be received may be whether new data can be received on the currently allocated or currently used resource or resource unit, or whether data (including newly transmitted or retransmitted data) that is transmitted next time can be received.

For example, when the data cannot continue to be received, it indicates that the new data cannot be received, or it indicates that both the new data and the retransmitted data cannot be received.

In an example, the second part may include a reference signal distributed in time domain. In this way, channel estimation and synchronization (channel phase tracking) performance can be improved, thereby improving anti-noise and anti-interference capabilities.

Figure 3:
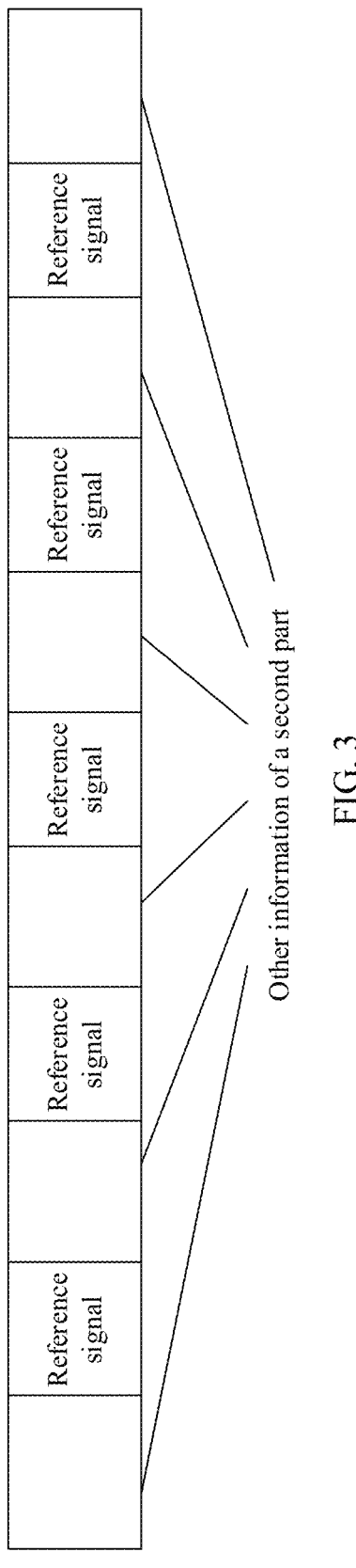
FIG. 3 is a schematic diagram of reference signals distributed at equal intervals in a second part according to this application.

In one embodiment, the reference signals included in the second part may be distributed at equal intervals in time domain or distributed at unequal intervals in time domain. In other words, the second part may include reference signals distributed at equal intervals in time domain, or may include reference signals distributed at unequal intervals in time domain. For example, FIG. 3 shows a schematic diagram of the reference signals distributed at equal intervals in the second part.

In another example, the data part may include a reference signal distributed in time domain. In this way, channel estimation and synchronization performance can be improved, thereby improving anti-noise and anti-interference capabilities.

Figure 4:
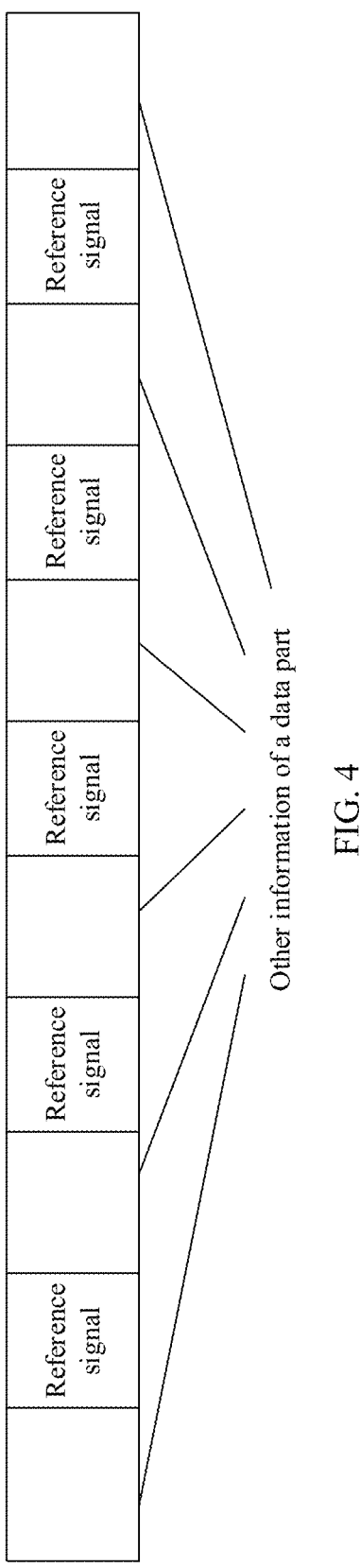
FIG. 4 is a schematic diagram of reference signals distributed at equal intervals in a data part according to this application.

In one embodiment, the reference signals included in the data part may be distributed at equal intervals in time domain or distributed at unequal intervals in time domain. In other words, the data part may include reference signals distributed at equal intervals in time domain, or may include reference signals distributed at unequal intervals in time domain. For example, FIG. 4 shows a schematic diagram of the reference signals distributed at equal intervals in the data part.

Further, In one embodiment, the second part may indicate the distribution pattern of the reference signal of the data part, where the pattern indicates symbols in which the reference signals are distributed. For example, the control information of the second part may indicate the distribution pattern of the reference signal of the data part. In this way, blind detection at the signal receive end (namely, the second device) can be avoided, and the distribution pattern of the reference signal in the data part can be flexibly adjusted based on a device capability and a channel condition, so that transmission reliability can be ensured and a resource waste can be avoided.

For example, when the data part includes the reference signals distributed at equal intervals in time domain, the second part may indicate the distribution pattern of the reference signals of the data part by indicating density of the reference signals of the data part.

In still another example, the second part and the data part may jointly include a reference signal distributed in time domain. In this way, channel estimation and synchronization performance can be improved, thereby improving anti-noise and anti-interference capabilities.

Figure 5:
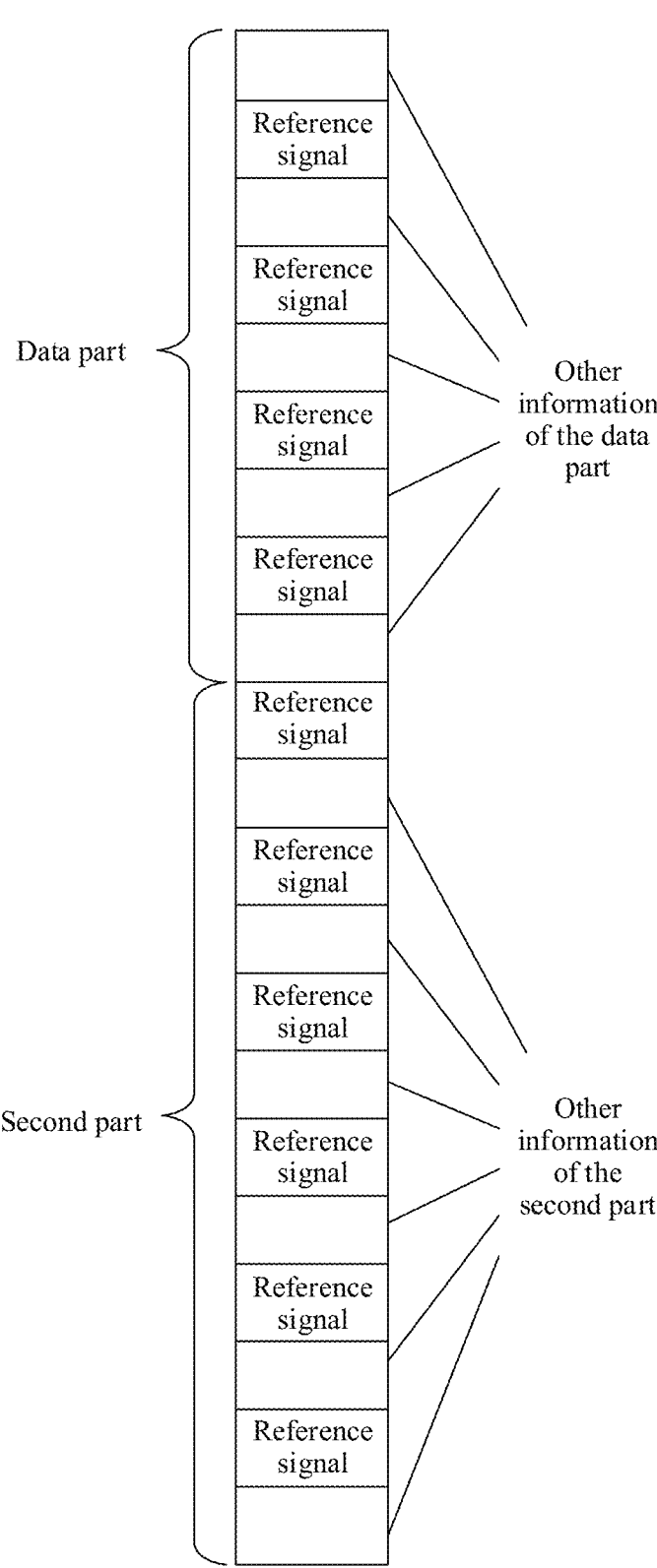
FIG. 5 is a schematic diagram of reference signals distributed at equal intervals in a part including a second part and a data part according to this application.

In one embodiment, that the second part and the data part jointly include a reference signal distributed in time domain may be the following several cases: (1) The second part includes reference signals distributed at equal intervals in time domain based on a first pattern, and the data part includes reference signals distributed at equal intervals in time domain based on a second pattern. In one embodiment, the first pattern and the second pattern may be the same. In this case, it indicates that the second part and the data part include a same pattern of the reference signals that are distributed at equal intervals in time domain. In one embodiment, the first pattern and the second pattern may be different. In this case, it indicates that each of the second part and the data part includes reference signals distributed at equal intervals in time domain, and the reference signals of the two parts are independent of each other when distributed at equal intervals in time domain. For example, distribution density and start locations of the first pattern and the second pattern are different. (2) A part including the second part and the data part includes reference signals distributed at equal intervals in time domain based on a third pattern. In other words, the part including the second part and the data part, as a whole, includes the reference signals distributed at equal intervals in time domain based on the third pattern. For example, FIG. 5 shows a schematic diagram (3) of the reference signals distributed at equal intervals in the part including the second part and the data part. The second part includes the reference signals distributed at equal intervals based on the first pattern in time domain, and the data part includes the reference signals distributed at unequal intervals in time domain. (3) The second part includes the reference signals distributed at unequal intervals in time domain, and the data part includes the reference signals distributed at equal intervals in time domain based on the second pattern. (4) The second part includes the reference signals distributed at unequal intervals in time domain, and the data part includes the reference signals distributed at unequal intervals in time domain. Certainly, there may be another distribution case. This is not limited in this application.

In one embodiment, when the second part and the data part jointly include the reference signal distributed in time domain, the second part may also indicate the distribution pattern of the reference signal of the data part.

It should be noted that, in the foregoing example in which the reference signal exists, when the reference signal exists, the reference signal is not encoded, but is modulated and mapped to some symbols. Other information (namely, information other than the reference signal) of the second part and/or the data part is encoded, for example, valid information+CRC of the second part is encoded and modulated, and then mapped to a symbol other than the symbol to which the reference signal is mapped. That is, when a part in which the reference signal exists is encoded, the reference signal is skipped. In other words, the reference signal is not encoded, and information or data other than the reference signal in the part is encoded.

It should be noted that, that the first device generates a signal may be understood as that the first device generates a frame or a frame of a signal, or may be understood in another way. This is not limited in this application. For example, in the foregoing description, the first signal includes the first part and the second part, or may further include the data part, which may mean that a frame structure of the first signal may include the first part and the second part, or may further include the data part. For example, FIG. 6 is a schematic diagram of a frame structure of a first signal. In FIG. 6, the frame structure of the first signal includes a sequence part, a control part, and a data part. The sequence part may include a preamble sequence, an M-sequence, and a second sequence (or at least one first sequence includes an M-sequence and a second sequence). The control part includes control information and a CRC scrambled by using the third sequence, and the control part is encoded by using the polar code. The data part includes data (or a PDU) and the CRC, the data part is encoded by using the polar code. It should be understood that FIG. 6 is merely an example, and is not intended to limit the first signal in this application. The first signal may alternatively be in another form. Examples are not enumerated one by one herein in this application.

Operation 202: The first device sends the first signal, that is, the first device sends the first signal to the second device, that is, the second device receives the first signal.

Specifically, that the first device sends the first signal may be: The first device sends the first part; and the first device sends the second part after sending the first part. In other words, that the second device receives the first signal may be: The second device receives the first part; and the second device receives the second part after receiving the first part. In other words, the time domain location of the first part is before the time domain location of the second part.

Operation 203: The second device obtains the control information.

Specifically, that the second device obtains the control information may be: The second device correspondingly demodulates and/or decodes each part of the first signal, to obtain the control information in the second part. For example, the second device demodulates the second part in the PSK modulation scheme and decodes the second part by using the polar code. Others are similar. In an embodiment, demodulation and/or decoding may be performed based on modulation and/or encoding of each part described in operation 201. Details are not described herein again.

In one embodiment, the first device may further send a second signal to the second device, and the second signal may be modulated in the GFSK modulation scheme. In other words, the first device and the second device may further support a frame structure of GFSK modulation, so that support for a low-cost and low-power-consumption device can be reserved.

In one embodiment, the second signal may also include at least two parts, and some or all of the at least two parts of the second signal are modulated in the GFSK modulation scheme. For example, the second part may include a sequence part and an information part. The sequence part may carry a sequence, and the information part may carry control information. In one embodiment, the information part may further carry service data and/or signaling.

For example, any part of the second signal is not encoded. In other words, a frame structure of GFSK modulation is not encoded. In this way, a design can be simplified, and the low-cost and low-power-consumption device supports only a basic capability, thereby avoiding an increase in costs and power consumption caused by encoding and decoding additionally supported by this type of device.

According to the signal transmission method provided in embodiments of this application, when modulation is performed in the PSK modulation scheme, compared with the GFSK modulation scheme, the PSK modulation scheme can improve sensitivity of the receive end, and improve anti-noise and anti-interference capabilities. The second part is encoded by using the polar code, which can also improve anti-noise and anti-interference performance.

Figure 7:
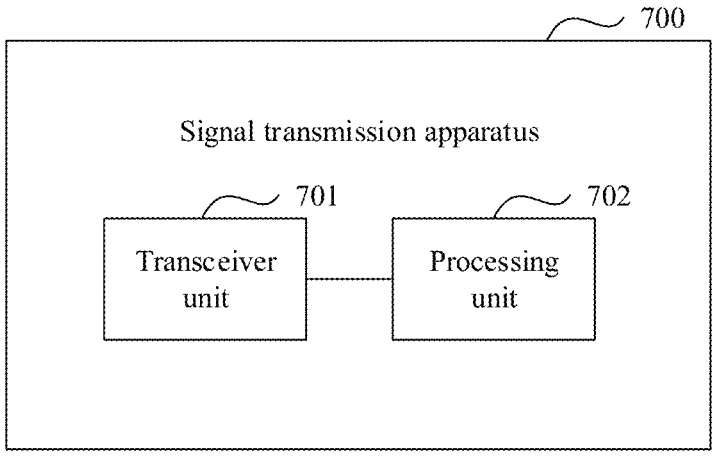
FIG. 7 is a schematic diagram of a structure of a signal transmission apparatus according to this application.

Based on the foregoing embodiments, an embodiment of this application further provides a signal transmission apparatus. As shown in FIG. 7, the signal transmission apparatus 700 may include a transceiver unit 701 and a processing unit 702. The transceiver unit 701 is configured to receive a signal (a message or data) or send a signal (a message or data) for the signal transmission apparatus 700, and the processing unit 702 is configured to control and manage an action of the signal transmission apparatus 700. The processing unit 702 may further control operations performed by the transceiver unit 701.

For example, the signal transmission apparatus 700 may be the first device (namely, the signal transmit end), a processor in the first device, a chip, a chip system, a function module, or the like in the foregoing embodiments. Alternatively, the signal transmission apparatus 700 may be the second device (namely, the signal receive end), a processor of the second device, a chip, a chip system, a function module, or the like in the foregoing embodiments.

In an embodiment, when the signal transmission apparatus 700 is configured to implement the functions of the first device in the embodiment shown in FIG. 2, the implementation may include the following.

The processing unit 702 may be configured to generate a first signal. The first signal includes a first part and a second part. The second part may be modulated in a PSK modulation scheme. The second part may be encoded by using polar code. The first part is used to transmit a preconfigured sequence, a predefined sequence, or a sequence generated according to a predefined rule. The second part is used to transmit control information. The transceiver unit 701 may be configured to send the first signal.

In one embodiment, the first part may be modulated in the PSK modulation scheme.

For example, the first part may successively include a preamble sequence and at least one first sequence. The first sequence may include an M-sequence and/or a second sequence. The second sequence may be a sequence generated based on an identifier of a first device and/or a sequence generated based on an identifier of a link of the first device.

Specifically, when sending the first signal, the transceiver unit 701 may be configured to: send the first part; and send the second part after sending the first part.

In an example, the first signal may further include a data part, and the data part may be modulated in the PSK modulation scheme.

In one embodiment, symbol rates of at least two of the first part, the second part, and the data part may be the same.

For example, a symbol rate of the data part may be 1 megahertz, 2 megahertz, or 4 megahertz.

In a possible implementation, the first part may include two same sequences.

In one embodiment, the second part may be encoded by using a first modulation scheme and a first code rate, where the first modulation scheme is one of the PSK modulation schemes, the first modulation scheme is preconfigured or predefined, and the first code rate is preconfigured, predefined, or determined according to a predefined rule; or the first modulation scheme is selected based on a first set, the first code rate is selected based on the first set, and the first set indicates at least one combination of a modulation scheme and a code rate; or the first modulation scheme is selected based on a second set, the second set indicates at least one modulation scheme, the first code rate is selected based on a third set, and the third set indicates at least one code rate.

Further, the first part may indicate the first modulation scheme and/or the first code rate.

In one embodiment, the second part may include a cyclic redundancy check bit.

For example, the second part may be scrambled by using a third sequence, or the cyclic redundancy check bit included in the second part may be scrambled by using the third sequence, and the third sequence is a sequence generated based on the identifier of the first device and/or a sequence generated based on the identifier of the link of the first device.

In one embodiment, the data part may be encoded by using the polar code.

In one embodiment, the second part may indicate a code rate for polar code encoding or whether the data part is encoded by using the polar code.

In one embodiment, the second part may indicate a modulation scheme of the data part.

In one embodiment, the second part may indicate length information of the data part.

For example, the second part may indicate at least one of the following: a number of transmission data of the data part, a number of a protocol data unit PDU of the data part, a number of a payload in the PDU, whether the transmission data is retransmitted, whether the PDU is retransmitted, or whether the payload in the PDU is retransmitted.

For example, the second part may indicate at least one of the following: feedback information of transmission data of a second device, feedback information of a PDU of the second device, feedback information of a payload in the PDU of the second device, a number of data expected to be transmitted by the second device next time, a number of a PDU expected to be transmitted by the second device next time, a number of a payload in the PDU expected to be transmitted by the second device next time, whether the data expected to be transmitted by the second device next time is retransmitted, whether the PDU expected to be transmitted by the second device next time is retransmitted, or whether the payload in the PDU expected to be transmitted by the second device next time is retransmitted.

In one embodiment, the second part may indicate whether the data part exists, indicate whether the data part includes the PDU, or indicate whether the payload in the PDU of the data part is null.

In one embodiment, the second part may indicate at least one of the following: a type of data in the data part, a type of the PDU in the data part, a type of the payload of the PDU in the data part, grouping information of data in the data part, grouping information of the PDU in the data part, or grouping information of the payload of the PDU in the data part.

In one embodiment, the first signal may be used for broadcast, the second part may indicate type information of the broadcast, and the type information of the broadcast may include at least one of the following: whether the broadcast can be scanned, whether the broadcast can be connected, whether the broadcast can be used for directional transmission, or whether the broadcast can be used for non-directional transmission.

In an example, the second part may indicate whether to continue to send data by using a currently allocated or currently used resource or resource unit, and/or indicate whether to continue to receive data by using the currently allocated or currently used resource or resource unit.

In another example, the second part may indicate whether there is data to be sent.

In still another example, the second part may indicate whether data can continue to be received.

In a possible manner, the second part may include a reference signal distributed in time domain.

For example, that the second part includes a reference signal distributed in time domain may be: The second part includes reference signals distributed at equal intervals in time domain.

In another possible manner, the data part may include a reference signal distributed in time domain.

For example, that the data part includes a reference signal distributed in time domain may be: The data part includes reference signals distributed at equal intervals in time domain.

In still another possible manner, the second part and the data part may include a reference signal distributed in time domain.

For example, that the second part and the data part include a reference signal distributed in time domain may be: the second part includes reference signals distributed at equal intervals in time domain based on a first pattern, and the data part includes reference signals distributed at equal intervals in time domain based on a second pattern; or a part including the second part and the data part includes reference signals distributed at equal intervals in time domain based on a third pattern.

In one embodiment, the second part may indicate the distribution pattern of the reference signal of the data part.

In one embodiment, the transceiver unit 701 may be further configured to send a second signal, where the second signal may be modulated in the GFSK modulation scheme.

For example, any part of the second signal is not encoded.

In one embodiment, when the signal transmission apparatus 700 is configured to implement the functions of the second device in the embodiment shown in FIG. 2, the implementation may include the following.

The transceiver unit 701 may be configured to receive a first signal. The first signal includes a first part and a second part. The second part may be modulated in a PSK modulation scheme. The second part is encoded by using polar code. The first part is used to transmit a preconfigured sequence, a predefined sequence, or a sequence generated according to a predefined rule. The second part is used to transmit control information. The processing unit 702 may be configured to obtain the control information.

In one embodiment, the transceiver unit 701 may be further configured to receive a second signal, where the second signal may be modulated in the GFSK modulation scheme. For example, any part of the second signal is not encoded.

Specifically, for detailed descriptions of the first signal, refer to the related descriptions in the foregoing embodiment. Details are not described herein again.

It should be noted that, in this embodiment of this application, division into the units is an example, and is merely a logical function division. In actual implementation, another division manner may be used. Functional units in embodiments of this application may be integrated into one processing unit, or each of the units may exist alone physically, or two or more units may be integrated into one unit. The integrated unit may be implemented in a form of hardware, or may be implemented in a form of a software function unit.

When the integrated unit is implemented in the form of a software function unit and sold or used as an independent product, the integrated unit may be stored in a computer-readable storage medium. Based on such an understanding, the technical solutions of this application essentially, or the part contributing to the conventional technology, or all or some of the technical solutions may be implemented in the form of a software product. The computer software product is stored in a storage medium and includes several instructions for instructing a computer device (which may be a personal computer, a server, or a network device) or a processor to perform all or some of the operations of the methods described in the embodiments of this application. The foregoing storage medium includes any medium that can store program code, such as a USB flash drive, a removable hard drive, a read-only memory (ROM), a random access memory (RAM), a magnetic disk, or an optical disc.

Figure 8:
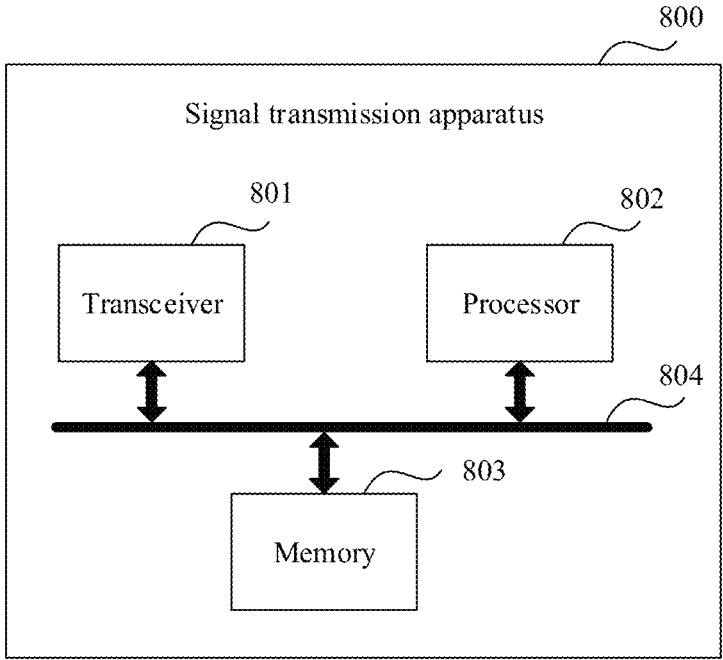
FIG. 8 is a diagram of a structure of a signal transmission apparatus according to this application.

Based on the foregoing embodiments, an embodiment of this application further provides a signal transmission apparatus. Refer to FIG. 8. A signal transmission apparatus 800 may include a transceiver 801 and a processor 802. In one embodiment, the signal transmission apparatus 800 may further include a memory 803. The memory 803 may be disposed inside the signal transmission apparatus 800, or may be disposed outside the signal transmission apparatus 800. The processor 802 may control the transceiver 801 to receive and send information, a signal, data, or the like.

Specifically, the processor 802 may be a central processing unit (CPU), a network processor (NP), or a combination of the CPU and the NP. The processor 802 may further include a hardware chip. The hardware chip may be an application-specific integrated circuit (ASIC), a programmable logic device (PLD), or a combination thereof. The PLD may be a complex programmable logic device (CPLD), a field programmable logic gate array (FPGA), a generic array logic (GAL), or any combination thereof.

The transceiver 801, the processor 802, and the memory 803 are connected to each other. In one embodiment, the transceiver 801, the processor 802, and the memory 803 are connected to each other through a bus 804. The bus 804 may be a peripheral component interconnect (PCI) bus, an extended industry standard architecture (EISA) bus, or the like. The bus may be classified into an address bus, a data bus, a control bus, and the like. For ease of representation, only one thick line is for representing the bus in FIG. 8, but this does not mean that there is only one bus or only one type of bus.

In one embodiment, the memory 803 is configured to store a program and the like. In an embodiment, the program may include program code, and the program code includes computer operation instructions. The memory 803 may include a RAM, and may further include a non-volatile memory, for example, one or more disk memories. The processor 802 executes the application program stored in the memory 803, to implement the foregoing function, so as to implement functions of the signal transmission apparatus 800.

For example, the signal transmission apparatus 800 may be the first device (namely, the signal transmit end) in the foregoing embodiment, or may be the second device (namely, the signal receive end) in the foregoing embodiment.

In an embodiment, when the signal transmission apparatus 800 implements functions of the first device in the embodiment shown in FIG. 2, the transceiver 801 may implement receiving and sending operations performed by the first device in the embodiment shown in FIG. 2, and the processor 802 may implement another operation other than the receiving and sending operations performed by the first device in the embodiment shown in FIG. 2. For detailed related descriptions, refer to the related descriptions in the foregoing embodiments shown in FIG. 2. Details are not described herein again.

In another embodiment, when the signal transmission apparatus 800 implements functions of the second device in the embodiment shown in FIG. 2, the transceiver 801 may implement receiving and sending operations performed by the second device in the embodiment shown in FIG. 2, and the processor 802 may implement another operation other than the receiving and sending operations performed by the second device in the embodiment shown in FIG. 2. For detailed related descriptions, refer to the related descriptions in the foregoing embodiments shown in FIG. 2. Details are not described herein again.

Based on the foregoing embodiments, an embodiment of this application provides a communication system. The communication system may include the first device, the second device, and the like in the foregoing embodiments.

An embodiment of this application further provides a computer-readable storage medium. The computer-readable storage medium is configured to store a computer program. When the computer program is executed by a computer, the computer may implement the signal transmission method provided in the foregoing method embodiments.

An embodiment of this application further provides a computer program product. The computer program product is configured to store a computer program. When the computer program is executed by a computer, the computer may implement the signal transmission method provided in the foregoing method embodiments.

An embodiment of this application further provides a chip system. The chip system includes at least one processor and a communication interface. The communication interface is configured to send and/or receive a signal. The at least one processor is configured to invoke a computer program stored in at least one memory, so that the chip system implements the signal transmission method provided in the foregoing method embodiments.

An embodiment of this application further provides a chip, including a processor. The processor is coupled to a memory, and is configured to invoke a program in the memory, so that the chip implements the signal transmission method provided in the foregoing method embodiments.

An embodiment of this application further provides a chip. The chip is coupled to a memory, and the chip is configured to implement the signal transmission method provided in the foregoing method embodiments.

A person skilled in the art should understand that the embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a function in one or more processes in the flowcharts and/or in one or more blocks in the block diagrams.

The computer program instructions may alternatively be stored in a computer-readable memory that can indicate a computer or another programmable data processing device to work in a manner, so that the instructions stored in the computer-readable memory generate an artifact that includes an instruction apparatus. The instruction apparatus implements a function in one or more procedures in the flowcharts and/or in one or more blocks in the block diagrams.

The computer program instructions may alternatively be loaded onto a computer or another programmable data processing device, so that a series of operations are performed on the computer or the another programmable device, so that computer-implemented processing is generated. Therefore, the instructions executed on the computer or the another programmable device provide operations for implementing a function in one or more procedures in the flowcharts and/or in one or more blocks in the block diagrams.

It is clear that a person skilled in the art can make various modifications and variations to this application without departing from the scope of this application. This application is intended to cover these modifications and variations of this application provided that they fall within the scope of protection defined by the claims of this application and their equivalent technologies.

What is claimed is:

1. A signal transmission method, comprising:
generating, by a device comprising a transceiver, a first signal comprising a first part and a second part, wherein the second part is used to transmit control information and is modulated in a phase shift keying (PSK) modulation scheme and encoded using polar code, the first part successively comprises a preamble sequence and at least one first sequence comprising at least one of an M-sequence or a second sequence generated based on an identifier of at least one of a first device or a link of the first device; and the first part is used to transmit at least one of a preconfigured sequence, a predefined sequence, or a sequence generated according to a predefined rule; and transmitting, by the transceiver, the first signal over a wireless communication channel, comprising:
transmitting the first part; and
transmitting the second part after the first part is transmitted.

2. The method according to claim 1, wherein the method further comprises:
sending a second signal, wherein the second signal is modulated in a Gaussian frequency-shift keying (GFSK) modulation scheme.

3. A data transmission method, comprising:
receiving, by a device comprising a transceiver, a first signal comprising a first part and a second part over a wireless communication channel, comprising:
receiving the first part; and
receiving the second part after the first part is received, wherein the second part is used to transmit control information and is modulated in a phase shift keying (PSK) modulation scheme and encoded using polar code; the first part successively comprises a preamble sequence and at least one first sequence comprising at least one of an M-sequence or a second sequence generated based on an identifier of at least one of a first device or a link of the first device; and the first part is used to transmit at least one of a predefined sequence or a sequence generated according to a predefined rule; and obtaining the control information.

4. The method according to claim 3, wherein the method further comprises:

receiving a second signal, wherein the second signal is modulated in a Gaussian frequency-shift keying (GFSK) modulation scheme.

5. The method according to claim 3, wherein the first part is modulated in the PSK modulation scheme.

6. The method according to claim 3, wherein the first signal further comprises a data part that is modulated in the PSK modulation scheme.

7. The method according to claim 6, wherein at least two among the first part, the second part, and the data part comprise same symbol rates.

8. The method according to claim 6, wherein a symbol rate of the data part is 1 megahertz, 2 megahertz, or 4 megahertz.

9. The method according to claim 3, wherein the first part comprises two same sequences.

10. The method according to claim 3, wherein the second part is encoded using a first modulation scheme and a first code rate, wherein the first modulation scheme is the PSK modulation scheme and is preconfigured or predefined, and the first code rate is preconfigured, predefined, or determined according to a predefined rule for the first code rate; or the first modulation scheme and the first code rate is selected based on a first set that indicates at least one combination of a modulation scheme and a code rate; or the first modulation scheme is selected based on a second set that indicates at least one modulation scheme and the first code rate is selected based on a third set that indicates at least one code rate.

11. The method according to claim 10, wherein the first part indicates the first modulation scheme and/or the first code rate.

12. The method according to claim 3, wherein the second part comprises a cyclic redundancy check bit.

13. The method according to claim 12, wherein the second part is scrambled using a third sequence, or the cyclic redundancy check bit comprised in the second part is scrambled using the third sequence, and wherein the third sequence is a sequence generated based on the identifier of at least one of the first device or the link of the first device.

14. The method according to claim 6, wherein the data part is encoded using the polar code.

15. The method according to claim 3, wherein the second part indicates at least one of the following:

whether a data part is encoded using the polar code;

a code rate for polar code encoding of the data part;

a modulation scheme of the data part;

length information of the data part;

a number of transmission data of the data part;

a number of a protocol data unit (PDU) of the data part;

a number of a payload in the PDU of the data part;

whether the transmission data of the data part is retransmitted;

whether the PDU of the data part is retransmitted;

whether the payload in the PDU of the data part is retransmitted;

feedback information of transmission data of a second device;

feedback information of a PDU of the second device;

feedback information of a payload in the PDU of the second device;

a number of data expected to be transmitted by the second device a next time;

a number of a PDU expected to be transmitted by the second device the next time;

a number of a payload in the PDU expected to be transmitted by the second device the next time;

whether the data expected to be transmitted by the second device the next time is retransmitted;

whether the PDU expected to be transmitted by the second device the next time is retransmitted;

whether the payload in the PDU expected to be transmitted by the second device the next time is retransmitted;

information about whether the data part exists;

whether the data part comprises the PDU;

whether the payload in the PDU of the data part is null;

a type of data in the data part;

a type of the PDU in the data part;

a type of the payload of the PDU in the data part;

grouping information of the data in the data part;

grouping information of the PDU in the data part;

grouping information of the payload of the PDU in the data part;

whether to continue to send data by using a currently allocated or currently used resource or resource unit;

whether to continue to receive data by using the currently allocated or currently used resource or resource unit;

whether there is data to be sent; or whether data continues to be received.

16. The method according to claim 3, wherein the first signal is used for broadcast, the second part comprises type information of the broadcast, and the type information of the broadcast comprises at least one of the following:

whether the broadcast is scanned, whether the broadcast is connected, whether the broadcast is used for directional transmission, or whether the broadcast is used for non-directional transmission.

17. A device, comprising:

a transceiver configured to transmit a signal;

a processor; and a memory comprising computer instructions that, when executed by the processor, cause the device to:

generate a signal comprising a first part and a second part, wherein the second part is used to transmit control information and is modulated in a phase shift keying (PSK) modulation scheme and encoded using polar code, the first part successively comprises a preamble sequence and at least one first sequence comprising at least one of an M-sequence or a second sequence generated based on an identifier of at least one of a first device or a link of the first device; and the first part is used to transmit at least one of a preconfigured sequence, a predefined sequence, or a sequence generated according to a predefined rule; and transmit, by the transceiver, the signal over a wireless communication channel, the transceiver further configured to:

transmit the first part; and transmit the second part after the first part is transmitted.

\* \* \* \* \*